US012568635B2

(12) United States Patent
Dermy

(10) Patent No.: US 12,568,635 B2
(45) Date of Patent: Mar. 3, 2026

(54) INTEGRATION OF FinFETs AND SCHOTTKY DIODES ON A SUBSTRATE

(71) Applicant: Schottky LSI, Inc., Mountain View, CA (US)

(72) Inventor: Pierre Dermy, Reno, NV (US)

(73) Assignee: Schottky LSI, Inc., Mountain View, CA (US)

( * ) Notice: Subject to any disclaimer, the term of this patent is extended or adjusted under 35 U.S.C. 154(b) by 649 days.

(21) Appl. No.: 17/950,952

(22) Filed: Sep. 22, 2022

(65) Prior Publication Data

US 2023/0080635 A1 Mar. 16, 2023

Related U.S. Application Data

(63) Continuation of application No. PCT/US2021/023719, filed on Mar. 23, 2021.

(Continued)

(51) Int. Cl.
| | |
|---|---|
| *H10D 8/60* | (2025.01) |
| *H10D 62/832* | (2025.01) |
| *H10D 84/00* | (2025.01) |
| *H10D 86/00* | (2025.01) |
| *H10D 86/01* | (2025.01) |

(52) U.S. Cl.
CPC .......... *H10D 8/60* (2025.01); *H10D 62/8325* (2025.01); *H10D 84/146* (2025.01); *H10D 86/011* (2025.01); *H10D 86/215* (2025.01)

(58) Field of Classification Search
CPC ...... H10D 8/60; H10D 84/146; H10D 86/011;
H10D 86/215; H10D 86/8325; H10D 30/061; H10D 30/0612; H10D 30/0614; H10D 30/0616; H10D 30/0618; H10D 62/8325; H10D 30/62; H10D 62/129;

(Continued)

(56) References Cited

U.S. PATENT DOCUMENTS 9,324,827 B1 4/2016 Singh et al.
10,096,723 B1 10/2018 Ningaraju et al.

(Continued)

OTHER PUBLICATIONS

Schottky LSI, Inc., PCT/US2021/023719, International Search Report and Written Opinion, Jul. 7, 2021, 12 pgs.

(Continued)

*Primary Examiner* — Monica D Harrison
(74) *Attorney, Agent, or Firm* — Morgan, Lewis & Bockius LLP

(57) ABSTRACT

This application is directed to integrating a field-effect transistor (FinFET) and a Schottky barrier diode on a substrate. A first fin structure and a second fin structure are formed on the substrate. The first fin structure includes a channel portion extending to two stressor portions on two opposite sides of the channel portion, and the second fin structure includes a junction portion. A source structure and a drain structure of the FinFET are formed on the two stressor portions of the first fin structure, respectively. A source metallic material, a drain metallic material, a first metallic material are formed to electrically couple to the source structure, the drain structure, and the junction portion of the second fin structure, respectively, thereby providing a Schottky junction between the junction portion of the second fin structure and the first metallic material.

20 Claims, 16 Drawing Sheets

Related U.S. Application Data

(60) Provisional application No. 63/003,234, filed on Mar. 31, 2020, provisional application No. 62/994,781, filed on Mar. 25, 2020.

(58) Field of Classification Search
CPC .. H10D 62/151; H10D 62/117; H10D 84/811; H10D 84/038; H10D 8/051; H10D 30/024
USPC .......................................................... 257/77
See application file for complete search history.

(56) References Cited

U.S. PATENT DOCUMENTS

| | | |
|---|---|---|
| 2012/0256274 A1 | 10/2012 | Riess et al. |
| 2014/0054648 A1 | 2/2014 | Itokawa et al. |
| 2014/0124863 A1 | 5/2014 | Cheng et al. |
| 2014/0273397 A1 | 9/2014 | Rodder et al. |
| 2016/0293717 A1* | 10/2016 | Kim .................... H10D 62/151 |
| 2016/0322498 A1 | 11/2016 | Chang et al. |
| 2019/0189771 A1 | 6/2019 | Dasgupta et al. |
| 2019/0326437 A1 | 10/2019 | Lan et al. |

OTHER PUBLICATIONS

Schottky LSI, Inc., PCT/US2021/023719, International Preliminary Report on Patentability, Sep. 22, 2022, 8 pgs.

Schottky LSI, Inc., KR20227036774, Request for the Submission of an Opinion, Jun. 11, 2024, 11 pgs.

Schottky LSI, Inc., EP21774598, Supplementary European Search Report, Mar. 7, 2024, 11 pgs.

J. Ma, G. Kampitsis, P. Xiang, K. Cheng and E. Matioli, "Multi-Channel Tri-Gate GaN Power Schottky Diodes With Low ON-Resistance," in IEEE Electron Device Letters, vol. 40, No. 2, pp. 275-278, Feb. 2019, 4 pgs. doi: 10.1109/LED.2018.2887199. keywords: {Gallium nitride;Performance evaluation; Aluminum gallium nitride;Wide band gap semiconductors;MODFETs;HEMTs;Anodes;GaN;SBD;multi-channel;tri-gate;tri-anode;breakdown;leakage current}.

* cited by examiner

N-FINFET

N-SBD

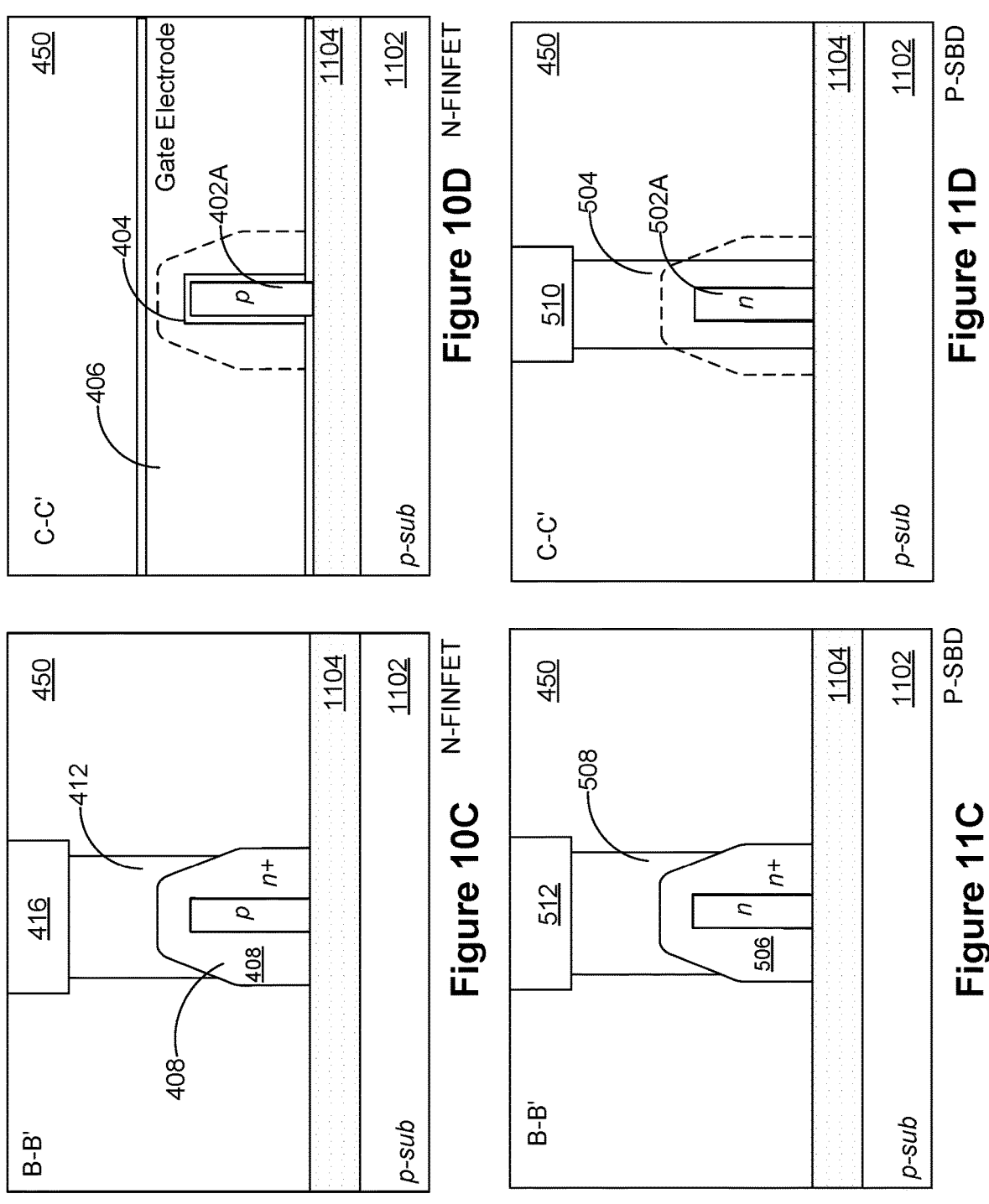
Figure 10C    N-FINFET
Figure 10D    N-FINFET
Figure 11C    P-SBD
Figure 11D    P-SBD

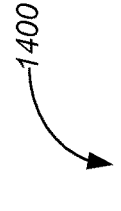

Figure 14

Form a field-effect transistor (FinFET) and a Schottky barrier diode on a substrate 1402

Form a first fin structure and a second fin structure, wherein the first fin structure includes a channel portion extending to two stressor portions on two opposite sides of the channel portion, and the second fin structure includes a junction portion 1404

Form a source structure and a drain structure of the first fin structure, respectively 1406

Form a source metallic material, a drain metallic material, a first metallic material that are electrically coupled to the source structure, the drain structure, and the junction portion of the second fin structure, respectively, thereby providing a Schottky junction between the junction portion of the second fin structure and the first metallic material 1408

Define a junction access on the stressor layer, wherein the junction portion extends to an electrode portion in the second fin structure, and the junction access is disposed on the electrode portion of the second fin structure 1410

Form a second metallic material electrically coupled to the junction access, wherein in the Schottky barrier diode, the junction portion of the second fin structure is electrically coupled to the second metallic material via the junction access and the electrode portion of the second fin structure 1412

INTEGRATION OF FinFETs AND SCHOTTKY DIODES ON A SUBSTRATE

RELATED APPLICATIONS

The present application is a continuation of and claims priority to International Patent Application No. PCT/US2021/023719, entitled "Integration of FinFETs and Schottky Diodes on a Substrate," filed Mar. 23, 2021, which claims priority to U.S. Provisional Application No. 62/994,781, entitled "Integration of FinFETs and Schottky Diodes on a Substrate", filed on Mar. 25, 2020, and U.S. Provisional Application No. 63/003,234, entitled "Integration of FinFETs and Schottky Diodes on a Substrate", filed on Mar. 31, 2020, each of which is incorporated by reference in its entirety.

BACKGROUND

Various sectors of high technology industries have been driven by a sustained increase in size and density of integrated circuits (ICs) during the past few decades. These high technology industries include semiconductor, electronics, computer, and communication as well as their associated software fields for establishing system platforms and derived applications. So far, this increase in size and density of the ICs has been made possible primarily by new photolithography techniques using shorter light wavelengths and/or by chemical and physical manufacturing processes having desirable production yield, reproducibility, and quality control.

IC development has experienced multiple technology nodes. Each technology node corresponds to a specific semiconductor manufacturing process, design rules, circuit generations, and architecture. Each technology node is achieved by reducing sizes of the ICs, improving performance of metal-oxide-semiconductor field-effect transistor (MOSFET), and increasing levels and densities of metal interconnections. Each new technology node is thereby more complex than a previous technology node, requiring more expensive microfabrication techniques, facilities, and resources. Tools, time and manpower to implement very large scale integrated (VLSI) circuits also becomes more complex and costly at each new technology node. MOSFETs are integrated on a substrate with planar structures prior to a 20 nm technology node, and start to adopt three-dimensional (3D) structures to add height to channel widths beyond this technology node. An example of the 3D structures of the MOSFETs is a fin structure used to build a transistor channel. However, deployment of technology nodes have been focused on MOSFETs involving little or no other active semiconductor devices. It would be beneficial to engage different type of semiconductor devices into the integrated circuit than the current practice.

SUMMARY

This application is directed to integrating a fin field-effect transistor (FinFET) and a Schottky barrier diode on a substrate in a monolithic manner (e.g., via a semiconductor microfabrication process). Specifically, this application describes an overall IC manufacturing method of P-type and N-type low-threshold Schottky barrier diodes (LtSBDs). These LtSBDs are used with P-type and -type N MOSFETs that are offered in an existing or upcoming FinFET technology node of large scale industrial production, thereby implementing Schottky-based complementary metal-oxide-semiconductor (SCMOS) ICs. Microfabrication of P-type and N-type LtSBDs uses one additional and specific module of an existing semiconductor microfabrication processing. This additional module is added to a set of modules that are already in place in the front-end-of-line (FEOL) and middle-of-line (MOL), e.g., fabricated on a P-type bulk silicon substrate. In some implementations, this additional module includes at least (1) a photolithographic process to etch through a dielectric layer to expose fin structures dedicated to make LtSBDs and (2) surface cleaning and preparation on the exposed fin structure. Integration of the LtSBDs optionally involves an additional critical photomask (e.g., which is fabricated with the tightest tolerance achievable in a corresponding technology node in some situations) for this photolithographic process.

In one aspect of the application, a method is implemented to form an integrated semiconductor device including a fin field-effect transistor (FinFET) and a Schottky barrier diode (SBD) on a substrate. The method includes forming a first fin structure and a second fin structure. The first fin structure includes a channel portion extending to two stressor portions on two opposite sides of the channel portion, and the second fin structure includes a junction portion. The method further includes forming a source structure and a drain structure of the FinFET on the two stressor portions of the first fin structure, respectively. The method further includes forming a source metallic material, a drain metallic material, a first metallic material that are electrically coupled to the source structure, the drain structure, and the junction portion of the second fin structure, respectively, thereby providing a Schottky junction between the junction portion of the second fin structure and the first metallic material.

In some implementations, the junction portion extends to an electrode portion in the second fin structure, and a junction access is disposed on the electrode portion of the second fin structure. A second metallic material is electrically coupled to the junction access of the second fin structure. As such, in the Schottky barrier diode, the junction portion of the second fin structure is electrically coupled to the second metallic material via the junction access and the electrode portion of the second fin structure.

In some implementations, a plurality of trenches is defined and includes a source trench, a drain trench, and a first trench for accessing the source structure, the drain structure, and the junction portion of the second fin structure, respectively. The source, drain, and first metallic materials fill the source trench, the drain trench, and the first trench, respectively.

From another perspective, a method is implemented to form an integrated semiconductor device by forming a first fin structure and a second fin structure. The method includes depositing a stressor layer covering the substrate and the first and second fin structures and defining a source structure and a drain structure on the stressor layer. The source and drain structures are disposed on the two stressor portions of the first fin structure, respectively. The method further includes forming a source metallic material, a drain metallic material, a first metallic material that are electrically coupled to the source structure, the drain structure, and the junction portion of the second fin structure, respectively. A FinFET is formed on the substrate and includes the channel portion of the first fin structure, the source structure and the drain structure, and a Schottky barrier diode is formed on the substrate and includes a Schottky junction between the junction portion of the second fin structure and the first metallic material.

In yet another aspect, an integrated semiconductor device includes a substrate, a FinFET and a Schottky barrier diode.

The FinFET is formed on the substrate and has a first fin structure, a gate dielectric, a gate, a source structure and a drain structure. The first fin structure includes a channel portion extending to two stressor portions on two opposite sides of the channel portion. The source structure is electrically coupled to a source metallic material, and the drain structure is electrically coupled to a drain metallic material. The Schottky barrier diode is formed on the substrate and has a second fin structure and a first metallic material. The second fin structure includes a junction portion, and the junction portion forms a Schottky junction with the first metallic material. The first and second fin structures are made of the same type of material optionally having different doping types and concentrations. The same type of electrically conductive material is used to provide the first, source and drain metallic materials.

In another aspect, an integrated semiconductor device includes a substrate, a first fin structure and a second fin structure, a source structure and a drain structure, and an electrically conductive material. The first fin structure includes a channel portion extending to two stressor portions on two opposite sides of the channel portion, and the second fin structure includes a junction portion. The source and drain structures are disposed on the two stressor portions of the first fin structure, respectively. The electrically conductive material further includes a source metallic material, a drain metallic material and a first metallic material that are electrically coupled to the source structure, the drain structure, and the junction portion of the second fin structure, respectively. A FinFET is formed on the substrate and includes the channel portion of the first fin structure, the source structure and the drain structure. A Schottky barrier diode is formed on the substrate and includes a Schottky junction between the junction portion of the second fin structure and the first metallic material.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIG. 10A is a perspective view of an N-type FinFET structure formed on a silicon-on-insulator (SOI) substrate in accordance with some implementations, and FIGS. 10B, 10C and 10D are cross sectional views of the N-type FinFET structure at lines AA', BB' and CC' in accordance with some implementations, respectively.

FIG. 11A is a perspective view of a N-type SBD structure formed on an SOI substrate in accordance with some implementations, and FIGS. 11B, 11C and 11D are cross sectional views of the N-type SBD structure at lines AA', BB' and CC' in accordance with some implementations, respectively.

FIG. 14 is a flow chart of a method of forming an integrated semiconductor device on a substrate in accordance with some implementations.

Like reference numerals refer to corresponding parts throughout the several views of the drawings.

DESCRIPTION OF EMBODIMENTS

Figure 1:
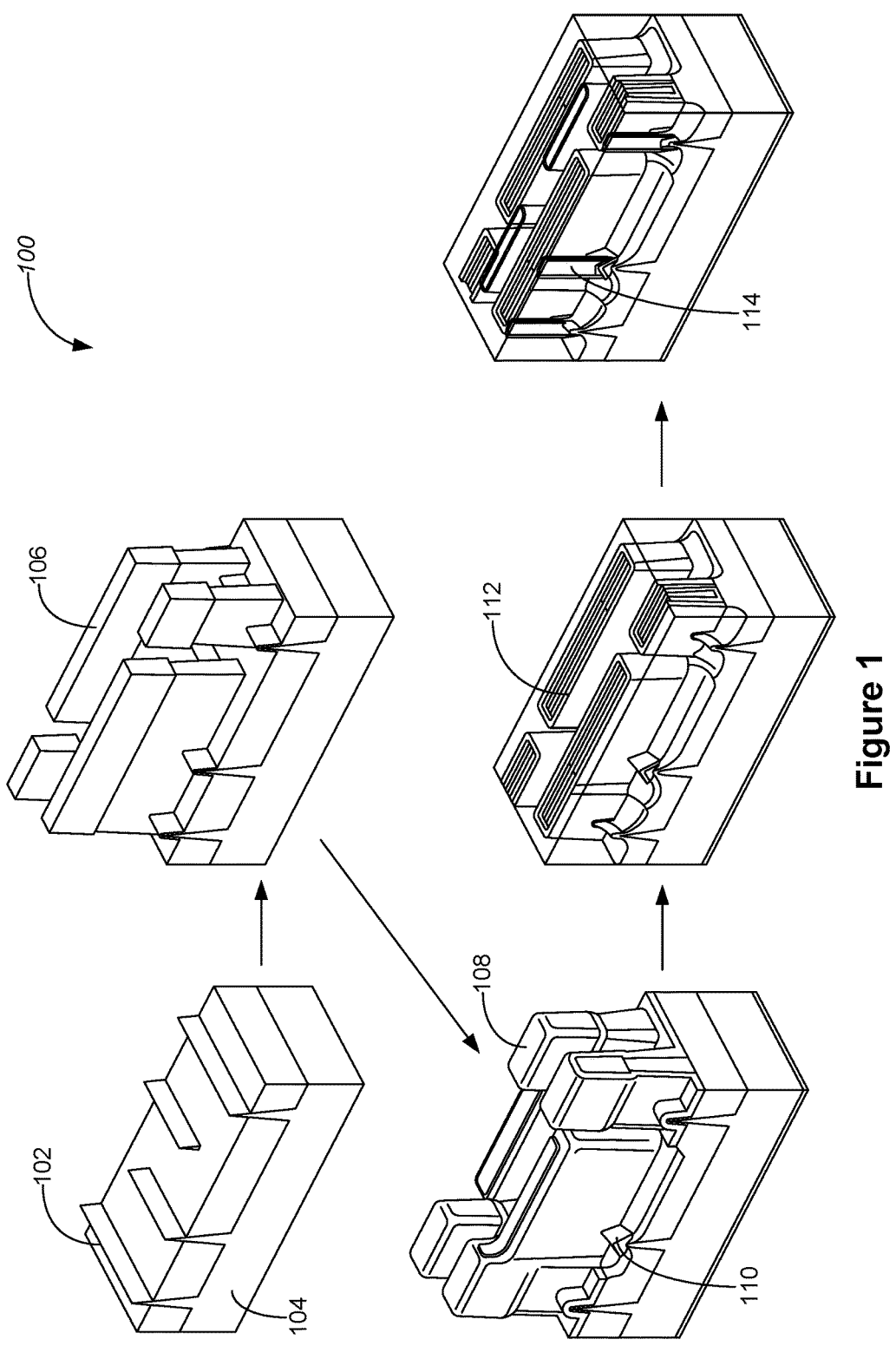
FIG. 1 shows perspective views of device and interconnection structures formed during an FEOL and MOL of a microfabrication process of forming FinFETs on a substrate in accordance with some implementations.

This application is directed to a Schottky-based complementary metal oxide semiconductor (SCMOS) technology that integrates P-type and/or N-type Schottky barrier diodes (SBDs) in a complementary metal oxide semiconductor (CMOS) microfabrication process. A Schottky barrier diode includes a metal plate disposed on a semiconductor fin structure to optionally wrap around a top or walls of the semiconductor fin structure. The fin structure applied in the Schottky barrier diode is doped with P-type or N-type impurity atoms of a predetermined doping concentration. Example P-type impurity atoms include Boron (B), and example N-type impurity atoms include Phosphorous (P) or Arsenic (As). The metal plate and the fin structure thereby produce a rectifying electrical contact (i.e., Schottky junction). The metal plate is referred to as a barrier metal. Electronic operation and physical models of the rectifying electrical contact are determined by electrical properties of the barrier metal.

The Schottky barrier diode has electrical conduction characteristics that are determined by material compositions of the barrier metal and semiconductor fin structure, and more specifically, by impurity characteristics of the fin structure and physical properties of a metal-to-semiconductor interface at the Schottky junction of the Schottky barrier diode. Example electronic properties of this metal-to-semi-conductor interface include, but are not limited to, a barrier height, which is associated with a turn-on/turn-off voltage of the Schottky barrier diode. In some embodiments, a combination of the barrier metal and semiconductor fin structure results in relatively low values of the barrier height and the turn-on/off voltage of the Schottky barrier diode, compared to threshold voltage of the MOSFETs integrated in the SCMOS technology. Thus, the Schottky barrier diode having a lower turn-on/off voltage is also called a low-threshold Schottky barrier diode (LtSBD).

Examples of the barrier metal include, but are not limited to, Nickel Silicide (e.g., NiSi) or Cobalt Silicide (e.g., $CoSi_2$). Other materials can be optionally applied as the barrier metal when a surface is shallowly doped with impurity atoms of metal materials, oxygen and/or hydrogen or when the surface is coated with a thin layer of metal material (e.g., Nickel, Nickel Silicide, Cobalt, Cobalt Silicide, and the like). Impurity doping techniques include ion implantation of ionized atoms into a target and in-situ physical/chemical deposition of a thin material layer containing the impurity atoms. In some situations, ion implantation or in-situ deposition is followed with thermal annealing, i.e., a controlled heating cycle at a raised temperature to drive the impurity atoms into a certain depth of the target and activate localized crystal structures. By these means, specific electronic properties of semiconductor devices are enabled individually and in dedicated groups, and the overall IC can be tested and qualified as a reliable product with desirable performance over a range of operating conditions and application environments.

In various embodiments of this application, integration of the Schottky barrier diodes in a CMOS microfabrication process is enabled by introduction of at least one new photomask and its associated set of photographic steps. This new photomask is used to identify locations of fin structures of the Schottky barrier diodes. The Schottky barrier diodes also correspond to one or more specific processing operations on their fin structures and need to modify existing photomasks applied in the CMOS microfabrication process. For example, a photomask is modified to keep polygons of a certain dielectric at locations of the Schottky barrier diodes to expose or protect the fin structures and its close surrounding from corresponding material processing operations. Optionally, the existing photomasks are modified by inserting logical formulas in a Computer Aided Design (CAD) software tool to control a photomask making machine to print circuit and device layouts onto the photomasks.

In some implementations, the FinFETs and the Schottky barrier diodes are integrated in a FinFET 14 nm technology node. A substrate integrating the FinFETs and the Schottky barrier diodes is optionally part of a monocrystalline silicon wafer or a silicon-on-insulator (SOI) wafer. The monocrystalline silicon wafer is optionally doped with boron (B) or phosphorus (P) to provide a P-type or N-type silicon substrate, respectively. On the SOI wafer, the fin structures are formed by selectively etching a layer of monocrystalline silicon deposited on the insulator of the SOI wafer. Alternatively, in some implementations, the fin structures are formed by a selective epitaxy process including forming trenches on a hard mask layer and filling the trenches with a semiconductor material forming the fin structures. A similar selective epitaxy process is applied to form silicon germanium (SiGe) P+ source/drain structures and silicon carbide (SiC) N+ source/drain structures. The insulator is optionally a layer of silicon dioxide ($SiO_2$) or sapphire ($Al_2O_3$) formed on top of a silicon body. In some implementations, the substrate is part of a wafer of sapphire or any other electric insulator.

FIG. 1 shows perspective views of device and interconnection structures formed during a FEOL and MOL of a microfabrication process 100 of forming FinFETs on a substrate in accordance with some implementations. Each of the FEOL and MOL of the microfabrication process 100 includes a respective sequence of semiconductor processing operations. Each semiconductor processing operation involves a respective manufacturing equipment. In some embodiments, a subset of the processing operations is grouped into a module according to photolithography operations.

In some implementations, the FEOL is the first portion of the microfabrication process 100 where the individual devices (transistors, capacitors, resistors, Schottky barrier diodes) are patterned on a substrate. The FEOL covers semiconductor processing operations (e.g., ion implantation, deposition and patterning of thin film layers) prior to deposition of metal interconnect layers. The FEOL includes a plurality of patterning modules. A patterning module can be refined and repeatedly used to reduce feature sizes printed by photolithography equipment and techniques selected for the patterning module. Referring to FIG. 1, a plurality of fin structures 102 are defined on a substrate 104 with shallow trench isolation. Sacrificial gates 106 are formed on the fin structures 102. Dielectric spacers 108 are formed around the fin structures 102 to separate the fin structures 102 from corresponding source and drain structures 110. The source and drain structures are implanted with high dose impurities. The sacrificial gates 106 are replaced with gates 112 and gate dielectrics (e.g., $HfO_2$ or other high κ dielectrics). Trenches are formed on the substrate and filled with a metallic material 114 (e.g., NiSi, $NiSi_2$) to access the source and drain structures 110.

Alternatively, in some embodiments, the FEOL covers a first set of semiconductor processing operations up to formation of source and drain structures 110 and gates 112 of the MOSFETs, and the MOL includes a second set of semiconductor processing operations creating contacts to the sources and drain structures 110 of the MOSFETs from a lowest metal interconnect layer. The MOL (also called MOL) includes patterning and etching of trenches and filling the trenches with a nickel silicide based material 114 to contact the source and drain structures 110. When the lowest metal interconnect layer (also called M1 layer) is deposited during a back-end-of-line (BEOL) of the microfabrication process 100, the source and drain structures 110 are electrically coupled to the lowest meal interconnect layer via the nickel silicide filled trenches 114.

In some implementations, the microfabrication process 100 applies deep ultraviolet (DUV) light provided by a light source having a wavelength of 193 nm to implement a DUV immersion lithography (DUVIL). In some implementations, the microfabrication process 100 applies extreme ultraviolet (EUV) light provided by a light source having a wavelength of 13.5 nm to implement a EUV lithography.

The microfabrication process 100 includes a sequence of ion implantation operations to produce a variety of P-type and N-type structures in the MOSFETs, thereby resulting in different turn-on/off voltages, threshold voltages, conduction strengths, leakage currents, maximum operating voltages and other electronic characteristics. This variety of P-type and N-type structures is necessary for effective very-large-silicon-integration (VLSI) of circuits using P-type and N-type MOSFETs and for customizing the VLSI circuits for different applications and environments.

Figure 2:
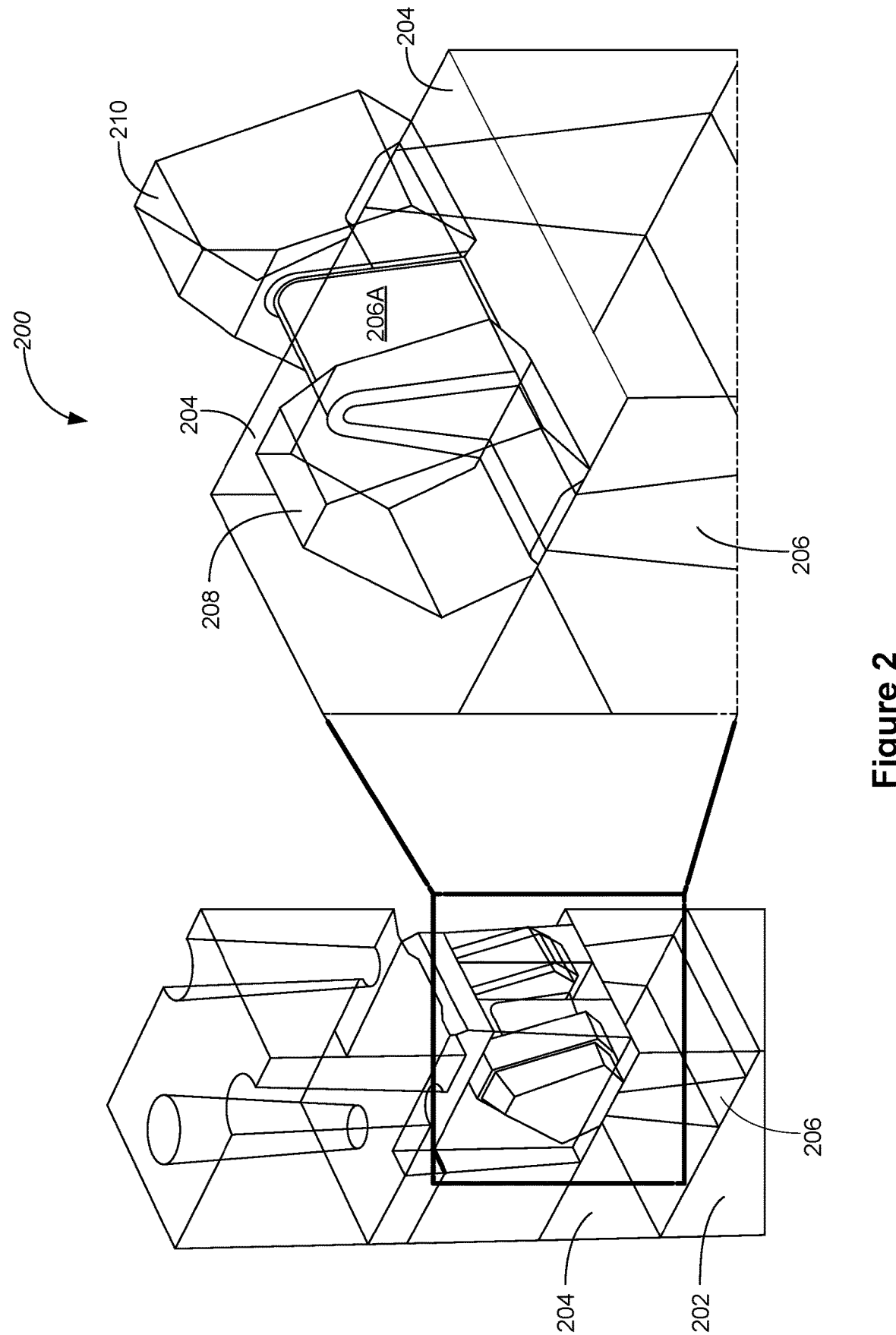
FIG. 2 shows enlarged perspective views of a single FinFET in accordance with some embodiments.

FIG. 2 shows enlarged perspective views of a single FinFET 200 in accordance with some embodiments. Outlines and boundaries of ion implant profiles are not included. The FinFET 200 corresponds to a shallow trench isolation region 204 on a semiconductor substrate 202, and a fin structure 206 is formed in the shallow trench isolation region 204. The shallow trench isolation region 204 is made of dielectrics (e.g., silicon oxide, nitride, oxynitride) and the fin structure 206 includes a P-type or N-type semiconductor material (e.g., silicon). In some embodiments, the substrate 202 is recessed and filled with the dielectrics on the show trench isolation region 204, and the fin structure 206 extends from a body of the substrate 202 and is optionally doped with P-type or N-type impurities. Alternatively, in some embodiments, a layer of dielectrics is deposited on top of the substrate 202, and a trench is opened and filled with the fin structure 202 that extends to the body of the substrate 202. The fin structure 206 is optionally doped via ion implantation or in-situ deposition.

The fin structure 206 goes beyond a top surface of the trench isolation region 204 to provide a channel portion 206A of the FinFET 200. The channel portion 206A of the fin structure 206 optionally extends to two stressor portions on two opposite sides of the channel portion. A source structure 208 and a drain structure 210 of the FinFET 200 are formed on the two stressor portions of the fin structure 206, respectively. If the FinFET 200 is a P-type transistor device, the source and drain structures 208 and 210 are made of silicon germanium (SiGe) epitaxially grown on the FinFET 200. If the FinFET 200 is an N-type transistor device, the source and drain structures 208 and 210 are made of silicon carbide (SiC) epitaxially grown on the FinFET 200. Referring to FIG. 2, the stressor portions can be partially or entirely recessed to the channel portion 206A, and therefore, the source and drain structures 208 and 210 are solid structures contacting the remaining stressor portions or channel portion 206A. Alternatively, in some implementations, the stressor portions are not recessed, the source and drain structures 208 and 210 are partially wrapped around the stressor portions of the fin structure 206.

A low-threshold Schottky barrier diode is integrated on the same substrate 202 based on a similar device structure shown in FIG. 2. The channel portion 206A of the fin structure 206 is used to form a semiconductor side of a Schottky metal-semiconductor junction. That said, the channel portion 206A of the FinFET is reconfigured to a junction portion of the Schottky barrier diode. At least one of the source and drain structures 208 and 210 is reconfigured to a junction access configured to provide a conductive path to the semiconductor side (i.e., the channel portion 206A) of the Schottky barrier diode.

The FinFET and Schottky barrier diode are defined by different semiconductor operations on the channel portion 206A of the fin structure 206. When the portion 206A of the fin structure 206 is covered by a gate dielectric and a gate, the fin structure 206 is configured to provide a channel of the FinFET 200 with the source and drain structures 208 and 210 disposed on two opposite sides of the channel. Conversely, when the portion 206A of the fin structure 206 is protected from being covered by a gate dielectric and a gate, the portion 206A of the fin structure 206 can be electrically coupled to the same conductive material used to access the source and drain structures 208 and 210. A Schottky metal-semiconductor junction is formed between the conductive material and the portion 206A of the fin structure 206, thereby providing a Schottky barrier diode based on the fin structure 206. More details of integration of the FinFET and Schottky barrier diode are described below with respect to FIGS. 4-12.

Figure 3:
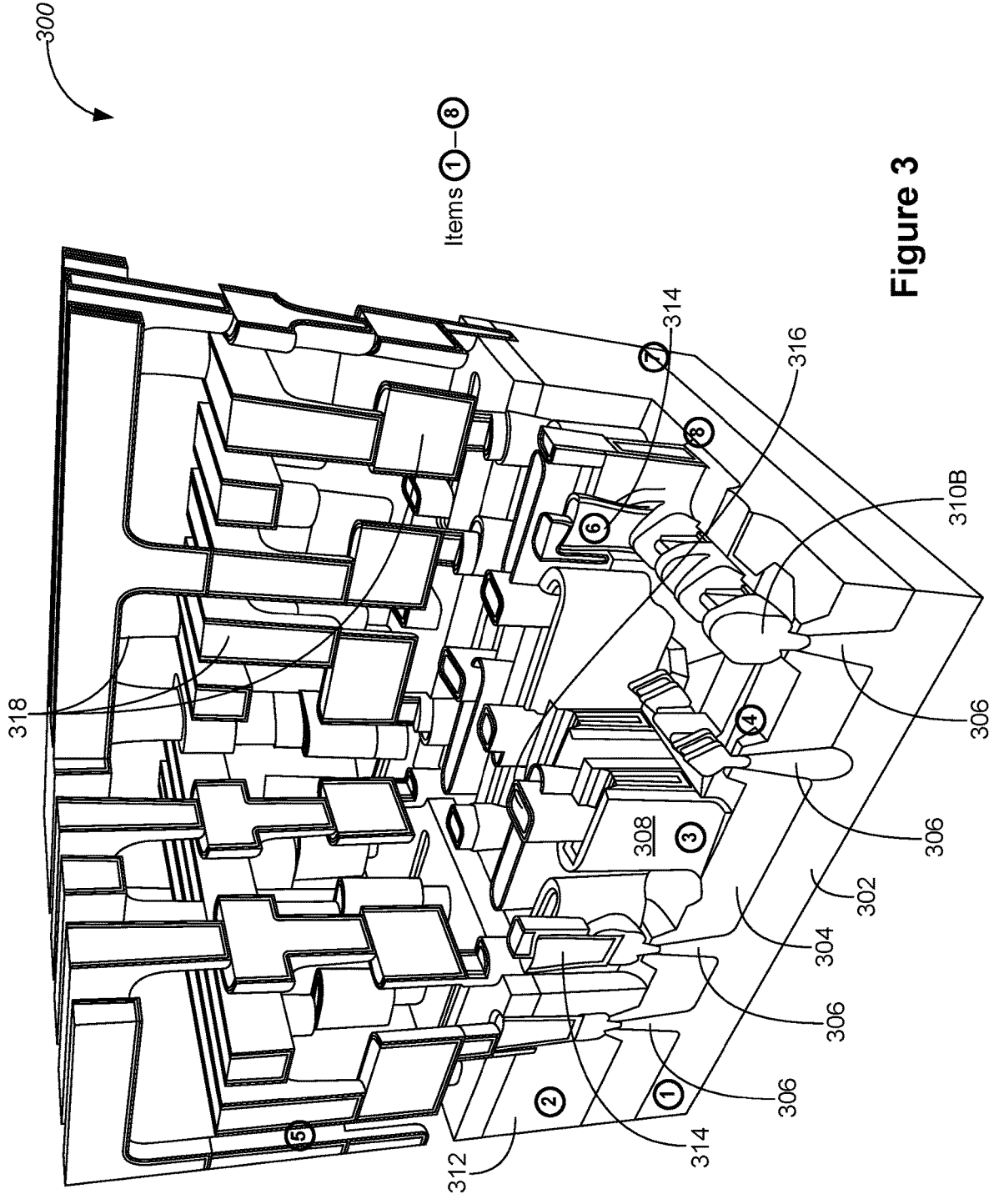
FIG. 3 is a perspective view of a cutout of a FinFET based integrated circuit including a Schottky barrier diode in accordance with some implementations.

FIG. 3 is a perspective view of a cutout of a FinFET based integrated circuit 300 including a Schottky barrier diode in accordance with some implementations. The FinFET based IC 300 is formed on a bulk silicon monocrystalline substrate 302. The substrate 302 includes a plurality of N-wells, a plurality of P-wells, isolation insulator 304, and fin structures 306 insulated by the isolation insulator 304. See item 1. The fin structures 306 raises above the isolation insulator 304. In FinFETs, each corresponding fin structure 306 includes a channel portion covered by a gate dielectric and a gate sequentially. Examples of the gate dielectric include a high κ dielectric (e.g., hafnium oxide). In an example, a silicon nitride and hafnium oxide insulator 308 optionally surrounds a metal gate of a FinFET in the FinFET based IC 300. See item 3. Silicon germanium (SiGe) is epitaxially grown and patterned to define source and drain structures 310A of P-type FinFETs, and silicon carbide (SiC) is epitaxially grown and patterned to define source and drain structures 310B of N-type FinFETs respectively. See item 4. Conversely, in Schottky barrier diodes, each corresponding fin structure 306 includes a junction portion that is not covered by a gate dielectric and a gate. A junction access is formed from silicon germanium (SiGe) or silicon carbide (SiC) to access the junction portion of each Schottky barrier diode, while SiGe and SiC are deposited and patterned to form the source and drain structures 310 of the FinFETs.

A dielectric layer 312 (e.g., silicon oxide) is applied to cover the fin, and source and drain structures of each FinFET and the fin structure and junction access of each Schottky barrier diode. See item 2. A plurality of trenches are drilled on the dielectric layer 312 and filled with an electrically conductive material 314 to access the source and drain structures 310 of the FinFETs and the fin structure and junction access of the Schottky barrier diodes of the FinFET based IC 300. An example of the electrically conductive material 314 is nickel silicide. Nickel silicide includes several intermetallic compounds of nickel and silicon, e.g., $Ni_3Si$, $Ni_{31}Si_{12}$, $Ni_2Si$, $Ni_3Si_2$, NiSi and $NiSi_2$. In an example, nickel disilicide is therefore used as a metal side of each Schottky barrier diode, and acts as an anode or cathode when it forms a Schottky junction with an N-type or P-type fin structure, respectively. In some situations, a photomask is added to expose the fin structures of the Schottky barrier diodes of the IC 300 to the electrically conductive material 314, e.g., after the plurality of trenches is formed. See item 6. In some implementations, selective epitaxy of SiGe and SiC (e.g., for the source and drain structures 310) is partially blocked over the junction portion of the fin structure of each Schottky barrier diode, which is reserved for deposition of the electrically conductive material 314 (e.g., $NiSi_2$) to form anode or cathode contacts of the Schottky barrier diodes via self aligned patterning. See item 7. Further, in some implementations, a Schottky barrier diode is P-type, and triple well implantations are applied to isolate an anode made of the P-type fin structure and the P-type substrate 302. See item 8. As such, existing operations in a CMOS microfabrication process are reconfigured to manufacture and integrate the Schottky barrier diodes on the same substrate 302 of the FinFET based IC 300.

The FinFET based IC 300 further includes a plurality of metal plugs 316 formed on top of the trenches filled with the electrically conductive material 314. The plurality of metal plugs 316 is electrically coupled to the source and drain structures 310 of the FinFETs and the metal and semiconductor sides of the Schottky barrier diodes. The plurality of metal plugs 316 is then interconnected to each other via a plurality of interconnect layers 318. In an example, the metal plugs 316 and interconnect layers 318 are made of copper and tantalum nitride. See item 5.

Figures 4A, 4B, 5A, 5B:
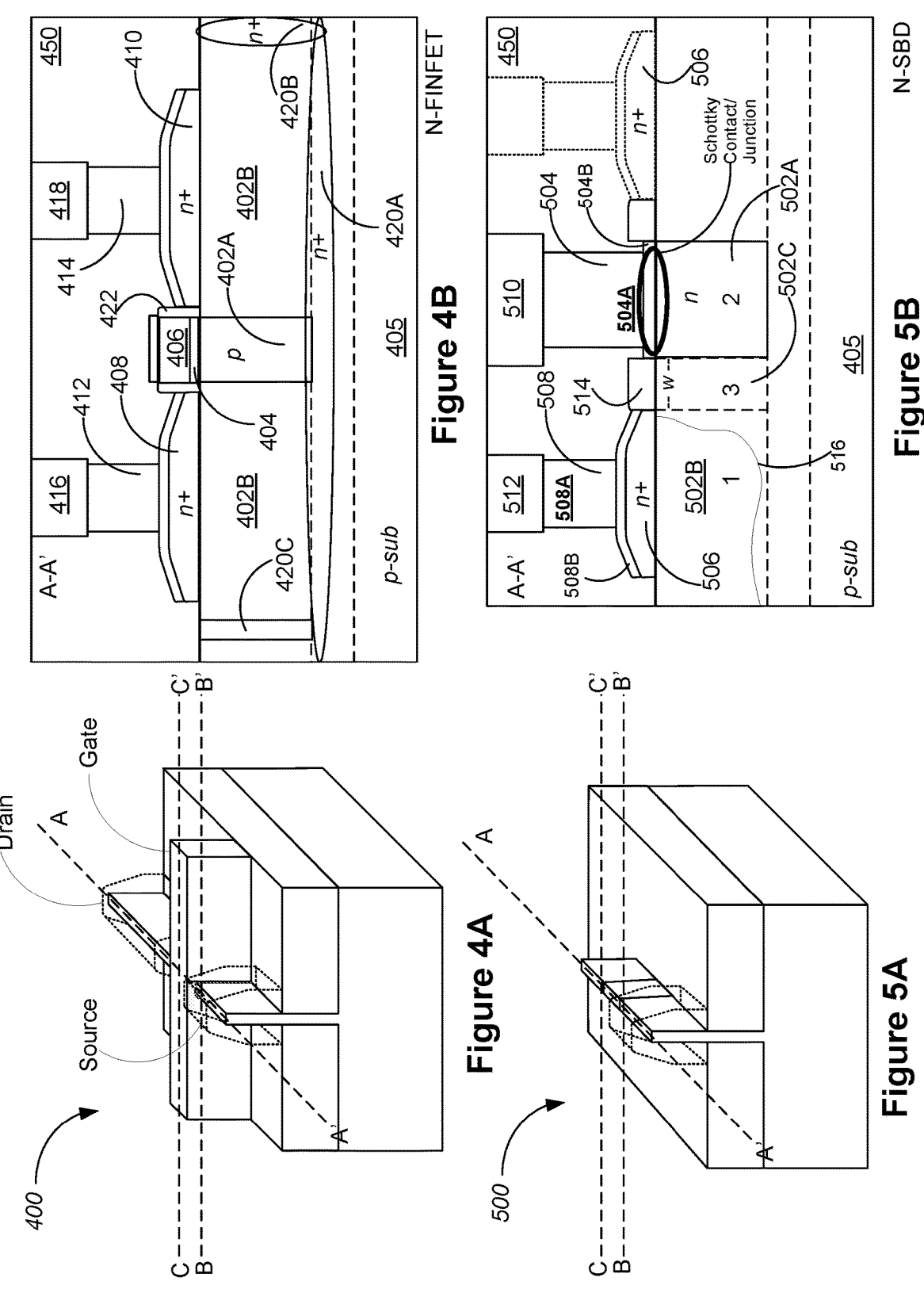
FIG. 4A is a perspective view of a three-dimensional N-type FinFET structure formed on a P-type substrate in accordance with some implementations.
FIGS. 4B, 4C and 4D are cross sectional views of the N-type FinFET structure at lines AA', BB' and CC', respectively.
FIG. 5A is a perspective view of a three-dimensional N-type SBD structure formed on a P-type substrate in accordance with some implementations.
FIGS. 5B, 5C and 5D are cross sectional views of the N-type SBD structure at lines AA', BB' and CC', respectively.
Figures 4C, 4D, 5C, 5D:
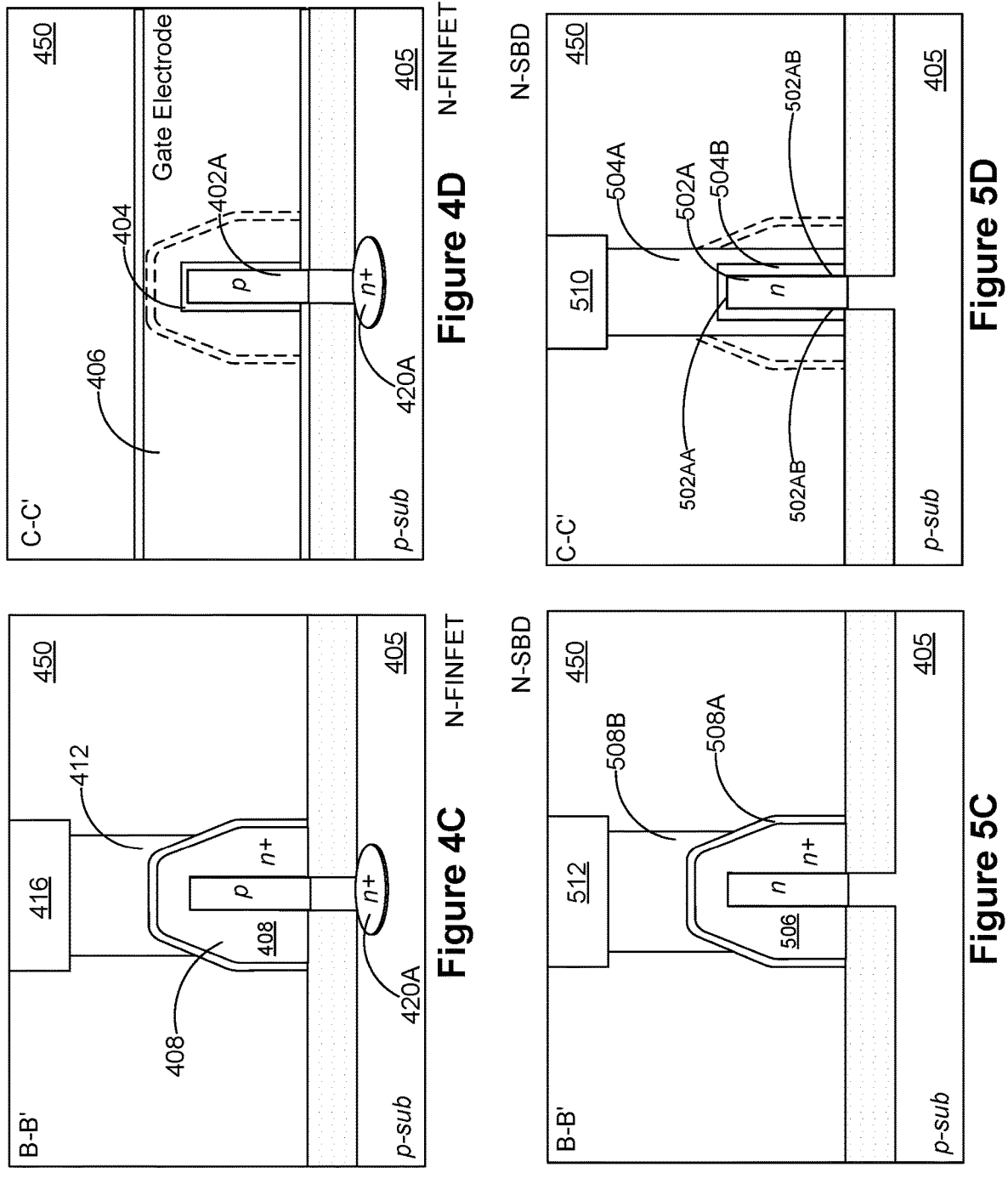

FIG. 4A is a perspective view of a three-dimensional N-type FinFET structure 400 formed on a P-type substrate 405 in accordance with some implementations, and FIGS. 4B, 4C and 4D are cross sectional views of the N-type FinFET structure 400 at lines AA', BB' and CC', respectively. FIG. 5A is a perspective view of a three-dimensional N-type SBD structure 500 formed on a P-type substrate 405 in accordance with some implementations, and FIGS. 5B, 5C and 5D are cross sectional views of the N-type SBD structure 500 at lines AA', BB' and CC', respectively. The N-type FinFET structure 400 and the N-type SBD 500 are optionally formed on different regions of the P-type substrate 405, and compared in FIGS. 4A-4D and 5A-5D. The FinFET structure 400 has a first fin structure 402, a gate dielectric 404, a gate 406, a source structure 408 and a drain structure 410. The first fin structure 402 includes a channel portion 402A extending to two stressor portions 402B on two opposite sides of the channel portion 402A. The source structure 408 is electrically coupled to a source metallic material 412, and the drain structure 410 is electrically coupled to a drain metallic material 414. The SBD structure 500 has a second fin structure 502 and a first metallic material 504. The second fin structure 502 includes a junction portion 502A, and the junction portion forms a Schottky junction with the first metallic material 504. The same type of electrically conductive material is used to provide the first, source and drain metallic materials 504, 412 and 414. Referring to FIGS. 5B and 5D, the first metallic material 504 includes a first metallic layer 504A and a second metallic layer 504B. The second metallic layer 504B contacts the junction portion 502A of the second fin structure 502, and includes one of cobalt silicide and nickel silicide. A thickness of the first metallic layer 504A is greater than that of the second metallic layer 504B. Optionally, the first metallic layer 504A is made of tungsten or a tungsten alloy. Likewise, each of the source and drain metallic materials 412 and 414 includes a respective first metallic layer and a respective second metallic layer.

The junction portion 502A extends to an electrode portion 502B in the second fin structure 502, and a junction access 506 is formed on the electrode portion 502B of the second fin structure 502, e.g., defined on a stressor layer jointly with the source and drain structures 408 and 410. In an example, given that both the FinFET 400 and the SBD 500 are N-type, the source structure 408, the drain structure 410 and the junction access 506 are doped with Arsenic or Phosphorus. In some implementations, the source structure 408, the drain structure 410 and the junction access 506 are stressor structures epitaxially grown on the second fin structure 502 and are optionally made of silicon carbide (SiC). Further, in some embodiments, the electrode portion 502B of the second fin structure 502 is at least partially recessed (516), and electrically coupled to the junction access 506. If the electrode portion 502B of the second fin structure 502 is entirely recessed, the junction access 506 is electrically coupled to remaining part of the second fin structure 502. Likewise, in some implementations, a subset of the stressor portions of the first fin structure 402 can be partially or entirely recessed while allowing the source or drain structure to remain electrically coupled to the first fin structure 402.

A second metallic material 508 is electrically coupled to and forms an ohmic contact with the junction access 506. Optionally, like the first, source and drain metallic materials, the second metallic material 508 includes a first metallic layer 508A and a second metallic layer 508B that forms the ohmic contact with the junction access 506. As such, in the N-type SBD 500, the junction portion 502A of the second fin structure 502 (N-type) is electrically coupled to the second metallic material 508 via the junction access 506 (N-type) and the electrode portion 502B of the second fin structure 502 (N-type).

In some implementations, the first, second, source and drain metallic materials 504, 508, 408 and 410 are defined by a first trench, a second trench, a source trench and a drain trench formed on the substrate 405. These trenches are etched through a dielectric layer to access the junction portion 502A, the junction access 506, the source structure 408 and the drain structure 410. The metallic materials 504, 408, 408 and 410 fill the first, second, source and drain trenches to provide electrically conductive paths to the junction portion 502A, the junction access 506, the source structure 408 and the drain structure 410, respectively.

In some implementations, a plurality of metal plugs are formed on the plurality of trenches and metallic materials. The plurality of metal plugs includes a first plug 510 electrically coupled to the first metallic material 504 filling the first trench, and a second plug 512 electrically coupled to the junction portion 502A of the second fin structure 502 via the second metallic material 508 filling the second trench, the junction access 506, and the electrode portion 502B of the second fin structure 502. By these means, the first and second plugs 510 and 512 form an anode and a cathode that are configured to electrically access a metal side and a semiconductor side of the Schottky junction of the SBD 500, respectively. Conversely, the plurality of metal plugs includes a source plug 416 and a drain plug 418 formed on and electrically coupled to the source and drain structures 408 and 410 of the FinFET 400, respectively.

In some implementations, the second fin structure 502 further includes a spacer portion 502C connecting the junction portion 502A to the electrode portion 502B, and the junction access 506 at least partially wraps around the electrode portion 502B and does not contact any surface of the spacer portion 502C. A diode spacer 514 is deposited on and optionally wrapped in part around the spacer portion 502C. The diode spacer 514 is configured to separate the junction access 506 and the first metallic material 504. Conversely, a transistor spacer 422 is formed adjacent to the gate dielectric 406 and gate 404 to separate the gate 406 from the source and drain structures. The diode spacer 514 is thicker than the transistor spacer 422, i.e., has a width (w) greater than that of the transistor spacer 422.

It is noted that the first and second fin structures 402 and 502 may be etched from a bulk silicon substrate 405 or deposited on a top surface of the substrate 405. The first fin structure 402 of the N-type FinFET 400 is P-type, and the second fin structure 502 of the P-type FinFET 500 is N-type. In some implementations, the FinFET 400 is formed in a P-well isolated from a body of the substrate 405 via a heavily doped N-type region 420A. The FinFET 400 is also isolated from other semiconductor devices on the substrate 405 via one or more doped N-type regions 420B or dielectric material 420C. The SBD 500 is formed in an N-well on the substrate 405. Alternatively, in some implementations, the substrate 405 includes a silicon-on-insulator (SOI) substrate. The first and second fin structures 402 and 502 are isolated from a semiconductor body of the SOI substrate via an insulator layer of the SOI substrate.

In some implementations, the gate dielectric 404 and the gate 406 covers a subset or all three exposed sides of the channel portion of first fin structure 402 of the FinFET 400. In some implementations, the FinFET 400 has a threshold voltage, and the SBD 500 has a turn-on voltage. A magnitude of the threshold voltage of the FinFET 400 is greater than a magnitude of the turn-on voltage of the SBD 500. In some implementations, structures associated with the source of the FinFET 400 (e.g., the stressor portion 402B, source structure 408, source metal material 412 and metal plug 416) are shared with structures associated with the source or drain of another N-type FinFET 400, or with structures associated with the cathode of another N-type SBD 500 (e.g., the electrode portion 502B, junction access 506, second metal material 508 and metal plug 512). In some implementations, structures associated with the drain of the FinFET 400 (e.g., the stressor portion 402B, source structure 410, source metal material 414 and metal plug 418) are shared with structures associated with the source or drain of another N-type FinFET 400, or with structures associated with the cathode of another N-type SBD 500 (e.g., the electrode portion 502B, junction access 506, second metal material 508 and metal plug 512). Likewise, the structures associated with the cathode of another N-type SBD 500 are shared with the structures associated with the source or drain of another N-type FinFET 400.

Figures 6A, 6B, 7A, 7B:
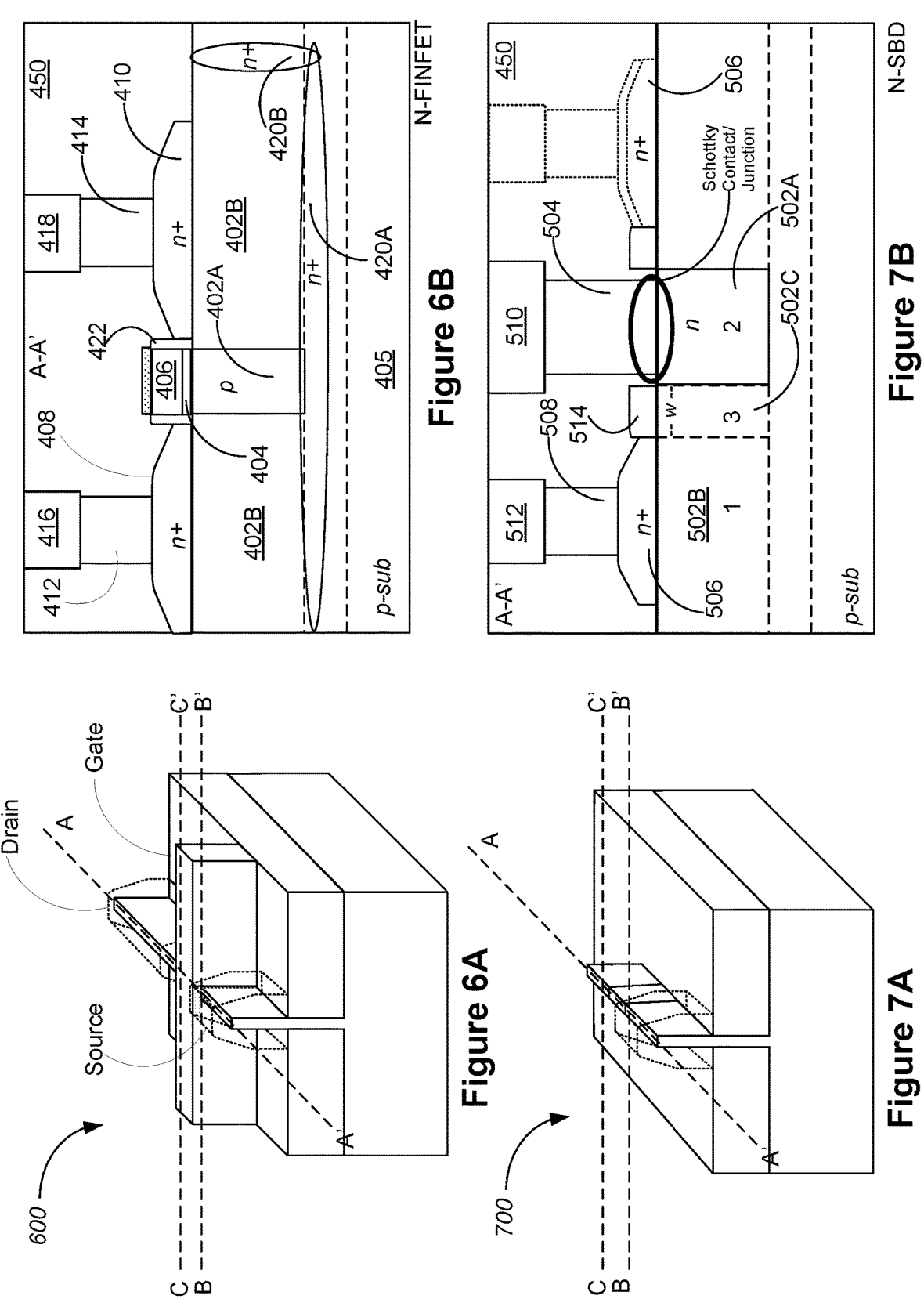
FIG. 6A is a perspective view of another three-dimensional N-type FinFET structure formed on a P-type substrate and applying silicide-based metallic materials in accordance with some implementations.
FIGS. 6B, 6C and 6D are cross sectional views of this N-type FinFET structure at lines AA', BB' and CC', respectively.
FIG. 7A is a perspective view of another three-dimensional N-type SBD structure formed on a P-type substrate and applying silicide-based metallic materials in accordance with some implementations.
FIGS. 7B, 7C and 7D are cross sectional views of this N-type SBD structure at lines AA', BB' and CC', respectively.
Figures 6C, 6D, 7C, 7D:
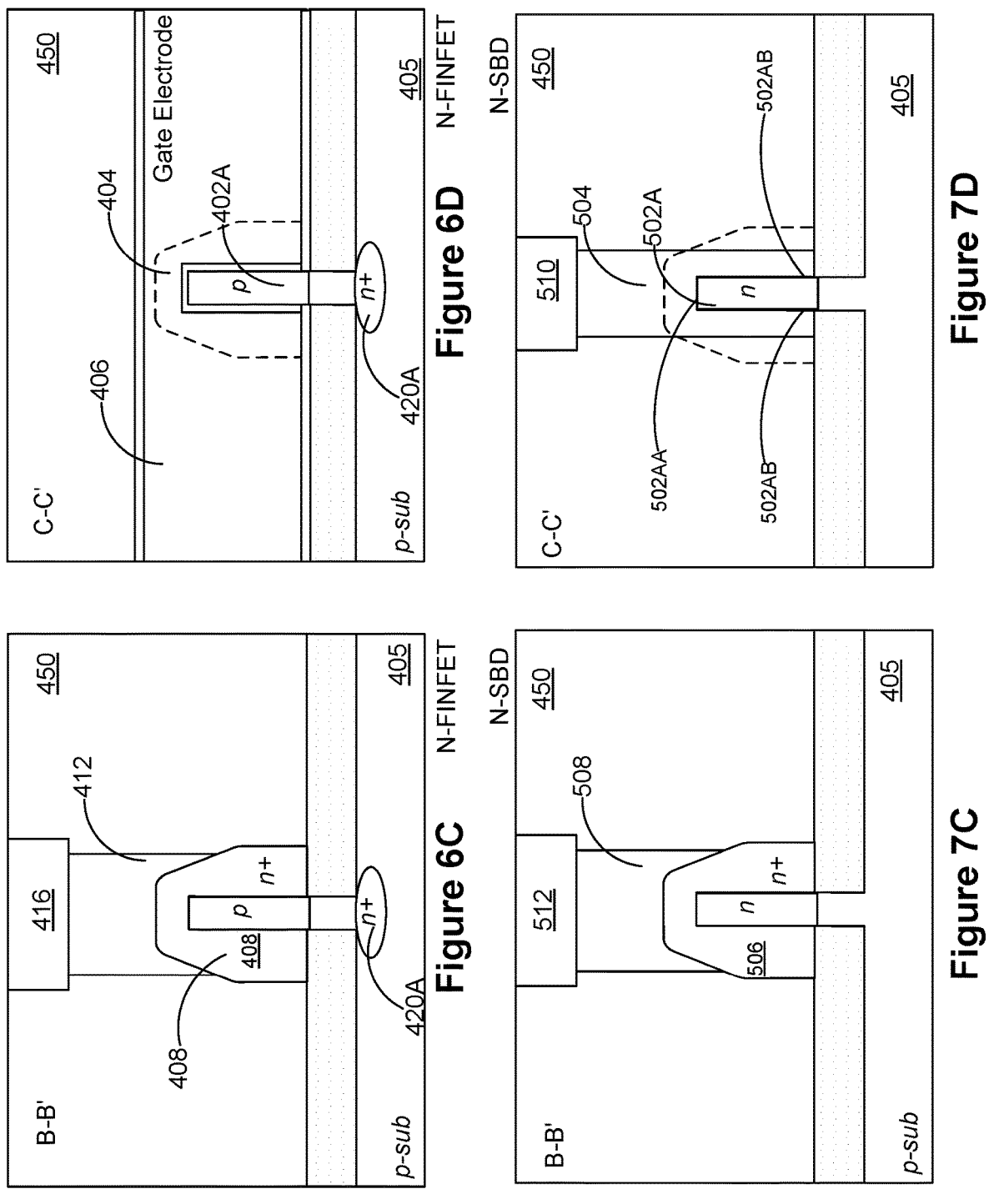

FIG. 6A is a perspective view of another three-dimensional N-type FinFET structure 600 formed on a P-type substrate 405 and applying silicide-based metallic materials 602 in accordance with some implementations, and FIGS. 6B, 6C and 6D are cross sectional views of this N-type FinFET structure 600 at lines AA', BB' and CC', respectively. FIG. 7A is a perspective view of another three-dimensional N-type SBD structure 700 formed on a P-type substrate 405 and applying silicide-based metallic materials 702 in accordance with some implementations, and FIGS. 7B, 7C and 7D are cross sectional views of this N-type SBD structure 700 at lines AA', BB' and CC', respectively. The N-type FinFET structure 600 and the N-type SBD structure 700 are optionally formed on different regions of the P-type substrate 405, and compared in FIGS. 6A-6D and 7A-7D. The N-type FinFET 600 and the N-type SBD 700 are consistent with the N-type FinFET 400 and the N-type SBD 500, respectively, except that electrically conductive materials used to access the source structure 408, the drain structure 410, the junction portion 502A, and the junction access 506 are different.

In some implementations, the source metallic material 412, the drain metallic material 414, and the first metallic material 504 are one of cobalt silicide and nickel silicide, and a Schottky junction is directly formed between the junction portion 502A of the second fin structure 502 and the one of cobalt silicide and nickel silicide of the first metallic material 504. Examples of cobalt silicide include $CoSi_2$, CoSi, $Co_2Si$ and $Co_3Si$. Further, in some situations, the second metallic material 508 is also the one of cobalt silicide and nickel silicide, forming an ohmic contact with the junction access 506 and providing an access to the junction portion 502A of the second fin structure 502. In some implementations, metal plugs 510 and 512 are formed on the first and second metallic materials 504 and 508 and function as part of an anode and a cathode of the corresponding SBD 700, respectively.

In some embodiments, prior to forming the metallic materials 412, 414, 504 and 508, a plurality of trenches is formed on a dielectric layer 450, and includes a source trench, a drain trench, and a first trench for accessing the source structure 408, the drain structure 410, and the junction portion 502A of the second fin structure 502, respectively. The source, drain, and first metallic materials 412, 414 and 504 are formed by filling the source trench, the drain trench, and the first trench with the source, drain, and first metallic materials 412, 414 and 504 with the same processing module, respectively. In some embodiments, a second trench is opened on the dielectric layer 450 with the source, drain and first trenches, and filled with the second metallic material 508 with the source, drain, and first metallic materials 412, 414 and 504.

In some implementations, referring to FIGS. 5C and 7C, the first metallic material 504 is wrapped around the second fin structure 502. That said, the first metallic material 504 is wrapped around a top surface 502AA and two side surfaces 502AB of the junction portion 502A of the second fin structure 502. Optionally, the first metallic material 504 directly comes into contact with a subset or all of the top surface 502AA and two side surfaces 502AB of the junction portion 502A of the second fin structure 502, forming the Schottky junction of the SBD 500. Further, in some implementations, referring to FIG. 5B, the junction access 506 is not only formed on one side of the Schottky junction, but also on the other side of the Schottky junction (i.e., on both sides of the Schottky junction). The junction portion 502A is therefore electrically coupled to two junction access 506 to reduce parasitic resistance coupled to the cathode of the SBD 500 or 700.

Figures 8A, 8B, 9A, 9B:
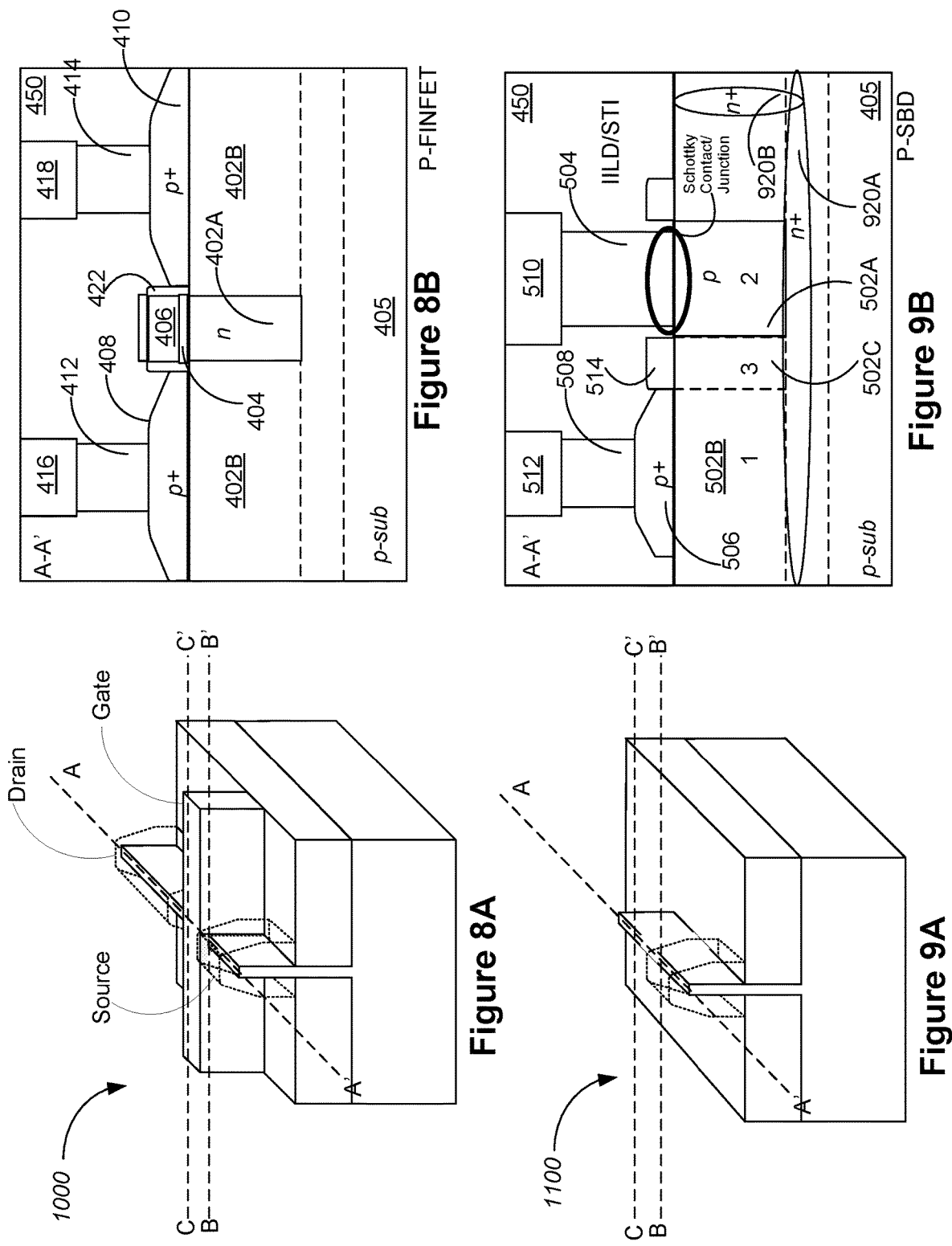
FIG. 8A is a perspective view of a P-type FinFET structure formed on a P-type substrate in accordance with some implementations.
FIGS. 8B, 8C and 8D are cross sectional views of the P-type FinFET structure at lines AA', BB' and CC', respectively.
FIG. 9A is a perspective view of a P-type SBD structure formed on a P-type substrate in accordance with some implementations.
FIGS. 9B, 9C and 9D are cross sectional views of the P-type SBD structure at lines AA', BB' and CC', respectively.
Figures 8C, 8D, 9C, 9D:
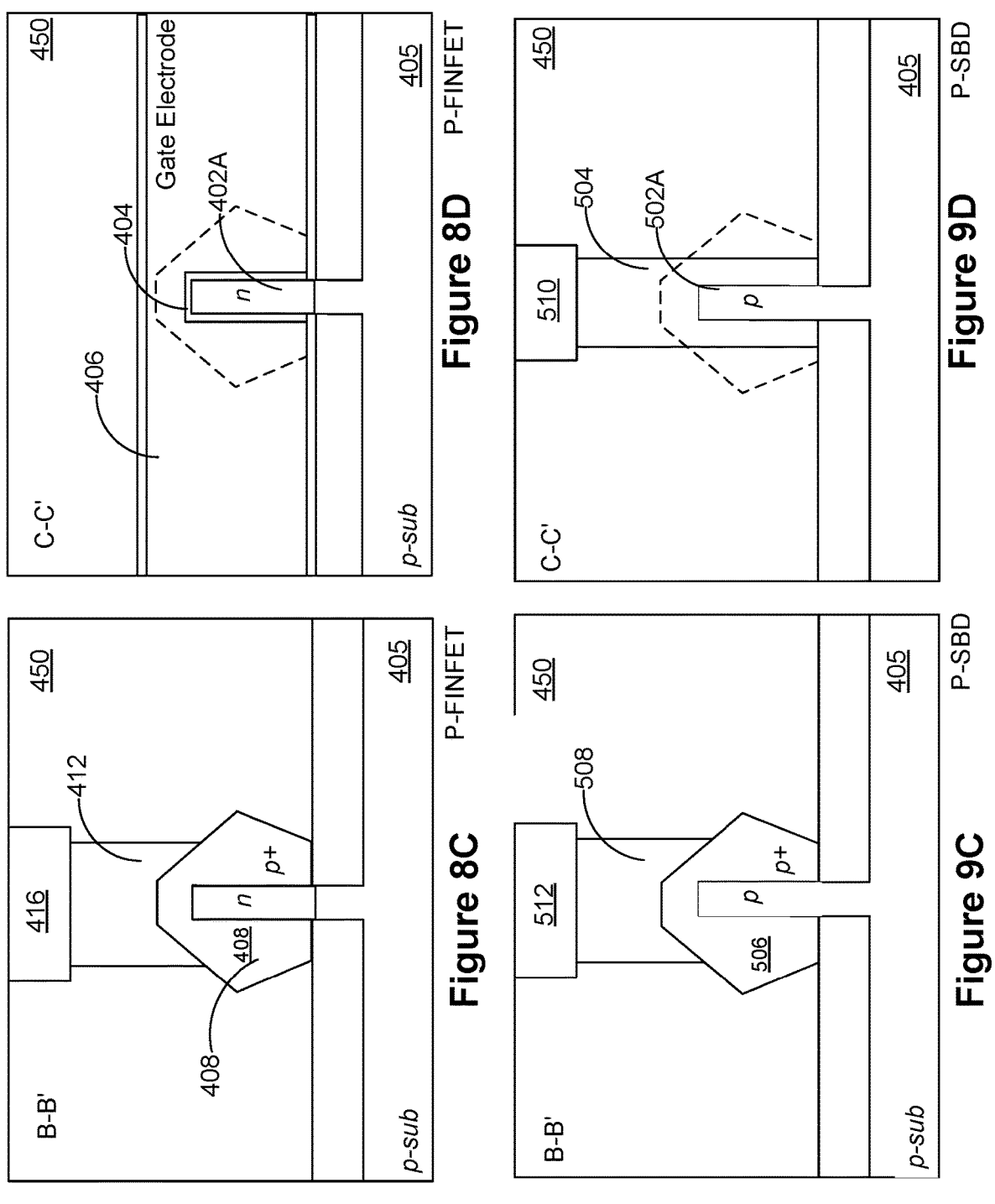

FIG. 8A is a perspective view of a P-type FinFET structure 800 formed on a P-type substrate 405 in accordance with some implementations, and FIGS. 8B, 8C and 8D are cross sectional views of the P-type FinFET structure at lines AA', BB' and CC', respectively. FIG. 9A is a perspective view of a P-type SBD structure 900 formed on a P-type substrate in accordance with some implementations, and FIGS. 9B, 9C and 9D are cross sectional views of the P-type SBD structure at lines AA', BB' and CC', respectively. The P-type FinFET structure 800 and the P-type SBD structure 900 are optionally formed on different regions of the P-type substrate 405 and compared in FIGS. 8A-8D and 9A-9D. In some embodiments, the N-type FinFET structure 600 and the N-type SBD structure 700 are formed on the same P-type substrate 405 with the P-type FinFET structure 800 and the P-type SBD structure 900.

The FinFET structure 800 has a first fin structure 402, a gate dielectric 404, a gate 406, a source structure 408 and a drain structure 410. The first fin structure 402 includes a channel portion 402A extending to two stressor portions 402B on two opposite sides of the channel portion 402A. The source structure 408 is electrically coupled to a source metallic material 412, and the drain structure 410 is electrically coupled to a drain metallic material 414. The SBD structure 900 has a second fin structure 502 and a first metallic material 504. The second fin structure 502 includes a junction portion 502A, and the junction portion forms a Schottky junction with the first metallic material 504. The junction portion 502A extends to an electrode portion 502B in the second fin structure 502, and a junction access 506 is formed on the electrode portion 502B of the second fin structure 502, e.g., defined on a stressor layer jointly with the source and drain structures 408 and 410. In some implementations, the P-type FinFET 800 has a threshold voltage, and the P-type SBD 900 has a turn-on voltage. The threshold voltage of the FinFET 800 is greater than the turn-on voltage of the SBD 900.

In an example, given that both the FinFET 800 and the SBD 900 are P-type, the source structure 408, the drain structure 410 and the junction access 506 are doped with Boron. In some implementations, the source structure 408, the drain structure 410 and the junction access 506 are stressor structures epitaxially grown on the second fin structure 502 and are optionally made of silicon germanium (SiGe). In some implementations, each of the P-type source structure 408, drain structure 410 and junction access 506 in FIGS. 8C and 9C has a geometrical shape that is distinct from each of the N-type source structure 408, drain structure 410 and junction access 506 in FIGS. 4C and 5C.

A second metallic material 508 is electrically coupled to and forms an ohmic contact with the junction access 506. In the P-type SBD 500, the junction portion 502A of the second fin structure 502 (P-type) is electrically coupled to the second metallic material 508 via the junction access 506 (P-type) and the electrode portion 502B of the second fin structure 502 (P-type). In some embodiments not shown in FIGS. 8A-8D and 9A-9D, each of the source metallic material 412, the drain metallic material 414, the first metallic material 504 and the second metallic material 508 includes a first metallic layer and a second metallic layer. The second metallic layer contacts the respective one of the source structure 408, the drain structure 410, the junction portion 502A and the junction access 506. The second metallic layer may include one of cobalt silicide and nickel silicide. Alternatively, in some embodiments shown in FIGS. 8A-8D and 9A-9D, the source metallic material 412, the drain metallic material 414, the first metallic material 504 and the second metallic material 508 are one of cobalt silicide and nickel silicide, and the Schottky junction is formed between the junction portion 502A and the one of cobalt silicide and nickel silicide.

Further, in some implementations, a plurality of metal plugs are formed on the plurality of trenches and metallic materials. The plurality of metal plugs includes a first plug 510 electrically coupled to the first metallic material 504 filling the first trench, and a second plug 512 electrically coupled to the junction portion 502A of the second fin structure 502 via the second metallic material 508 filling the second trench, the junction access 506, and the electrode portion 502B of the second fin structure 502. By these means, the first and second plugs 510 and 512 form part of a cathode and an anode that are configured to electrically access a metal side and a semiconductor side of the Schottky junction of the SBD 900, respectively.

The first fin structure 402 of the P-type FinFET 800 is N-type, and the second fin structure 502 of the P-type SBD 900 is N-type. In some implementations, the P-type SBD 900 is formed in a P-well isolated from a body of the substrate 405 via a heavily doped N-type region 920A. The SBD 900 is also isolated from other semiconductor devices on the substrate 405 via one or more doped N-type regions 920B. The P-type FinFET 800 is formed in an N-well on the substrate 405. Alternatively, in some implementations, the substrate 405 includes a silicon-on-insulator (SOI) substrate. The first and second fin structures 402 and 502 of the P-type FinFET 800 and SBD 900 are isolated from a semiconductor body of the SOI substrate via an insulator layer of the SOI substrate.

In some implementations, structures associated with the source of the FinFET 800 (e.g., the stressor portion 402B, source structure 408, source metal material 412 and metal plug 416) are shared with structures associated with the source or drain of another P-type FinFET 800, or with structures associated with the cathode of another P-type SBD 900 (e.g., the electrode portion 502B, junction access 506, second metal material 508 and metal plug 512). In some implementations, structures associated with the drain of the FinFET 800 (e.g., the stressor portion 402B, source structure 410, source metal material 414 and metal plug 418) are shared with structures associated with the source or drain of another P-type FinFET 800, or with structures associated with the cathode of another P-type SBD 900 (e.g., the electrode portion 502B, junction access 506, second metal material 508 and metal plug 512). Likewise, the structures associated with the cathode of another P-type SBD 900 are shared with the structures associated with the source or drain of another P-type FinFET 800.

The FinFET and SBD structures in FIGS. 4-9 are formed on a p-type substrate 405. Alternatively, FinFET and SBD structures are formed on an N-type substrate. P-type FinFET structures and N-type SBD structures have N-type fin structures that are isolated from a body of the N-type substrate via a heavily doped P-type region, and/or isolated from other semiconductor devices on the substrate via one or more doped P-type regions or dielectric material. N-type FinFET structures and P-type SBD structures have P-type fin structures that are optionally formed in P-wells on the N-type substrate. The FinFET structures and SBD structures are formed on the N-type substrate in an analogous manner to those formed on the P-type substrate with reference to FIGS. 4-9 as explained above. For brevity, details are not repeated here.

Figures 10A, 10B, 11A, 11B:
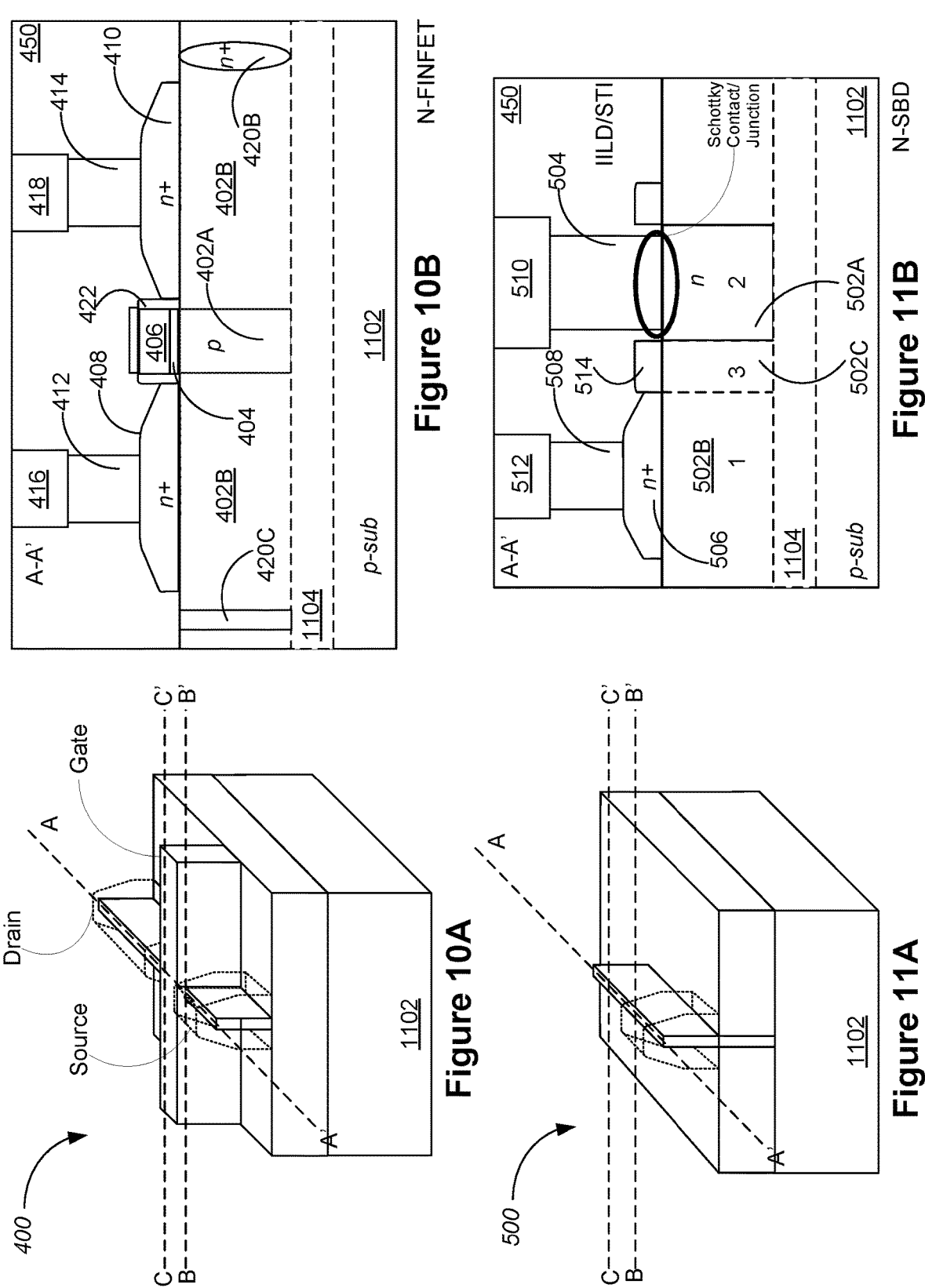

FIG. 10A is a perspective view of an N-type FinFET structure 1000 formed on a silicon-on-insulator (SOI) substrate 1002 in accordance with some implementations, and FIGS. 10B, 10C and 10D are cross sectional views of the N-type FinFET structure 1000 at lines AA', BB' and CC' in accordance with some implementations, respectively. FIG. 11A is a perspective view of a N-type SBD structure 1100 formed on an SOI substrate 1002 in accordance with some implementations, and FIGS. 11B, 11C and 11D are cross sectional views of the N-type SBD structure 1100 at lines AA', BB' and CC' in accordance with some implementations, respectively. The N-type FinFET structure 1000 and the N-type SBD structure 1100 are optionally formed on different regions of the SOI substrate 1002, and compared in FIGS. 10A-10D and 11A-11D.

The first and second fin structures 402 and 502 are isolated from a semiconductor body of the SOI substrate 1102 via an insulator layer 1104 of the SOI substrate 1102. Optionally, the first and second fin structures 402 and 502 are patterned from the semiconductor layer lying on top of the insulator layer 1104 of the SOI substrate 1102. Optionally, the first and second fin structures 402 and 502 are deposited on a top surface of the SOI substrate 1102. The first fin structure 402 of the N-type FinFET 1000 is P-type, and the second fin structure 502 of the N-type SBD 1100 is N-type. In some implementations, the FinFET 1000 or the SBD 1100 is isolated from other semiconductor devices on the substrate 1102 via one or more doped regions 420B or dielectric material 420C. Both the FinFET 1000 and SBD 1100 rely on the insulator layer 1104 to be separated from the body of the SOI substrate 1102. In some embodiments not shown in FIGS. 10A-10D and 11A-11D, a fin structure of a P-type FinFET is N-type, and a fin structure of a P-type SBD is P-type. The P-type FIinFET or SBD is isolated from other semiconductor devices on its substrate via one or more doped regions or dielectric material (not shown).

Figure 12A:
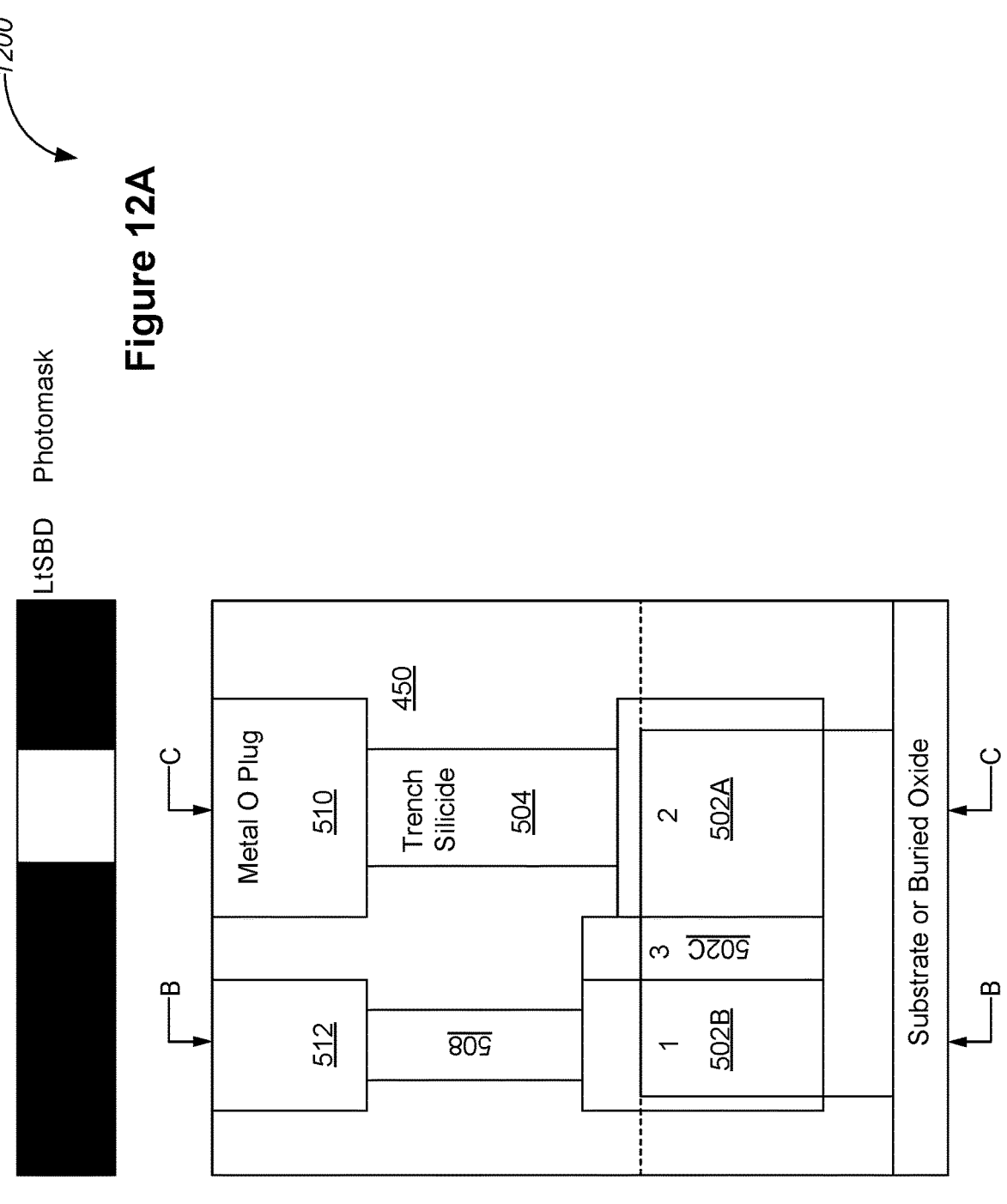
FIGS. 12A-12C are three cross sectional views of an SBD structure in accordance with some implementations.
Figure 12B:
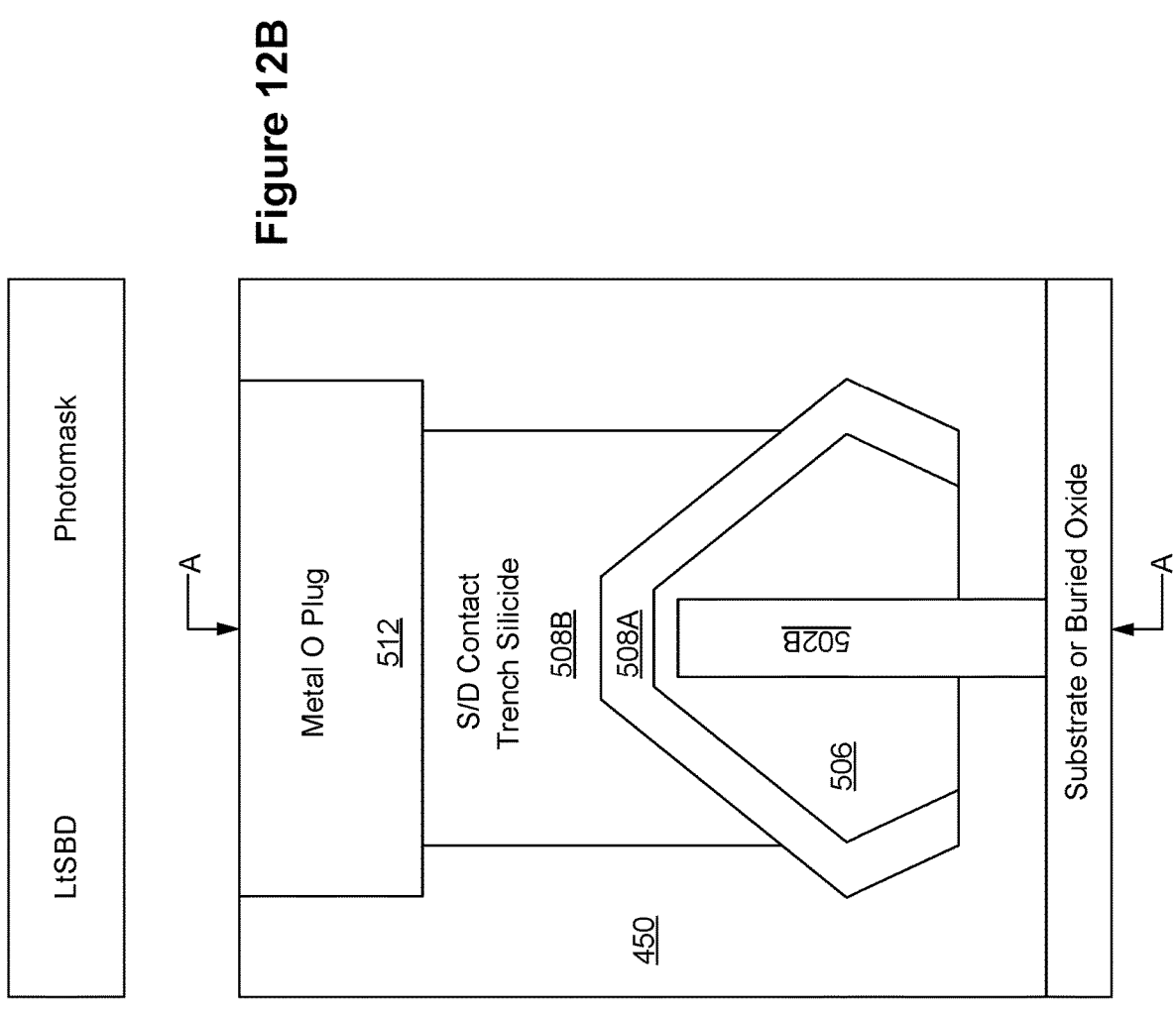
Figure 12C:
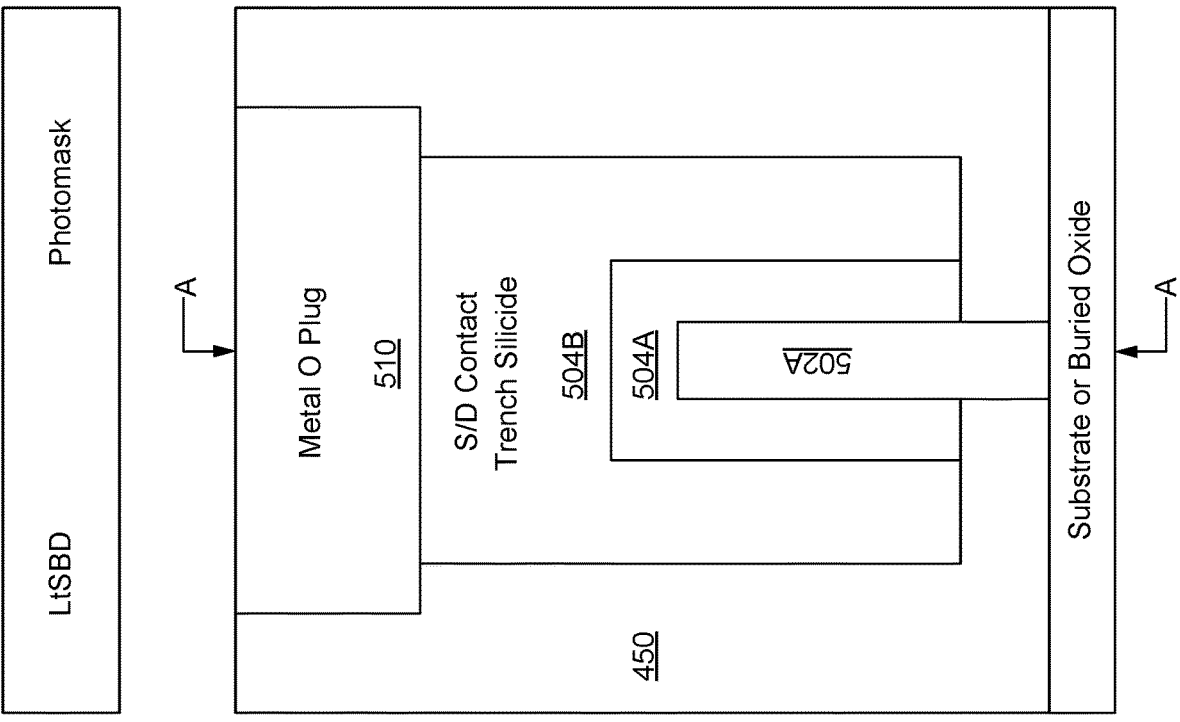

FIGS. 12A-12C are three cross sectional views of an SBD structure 1200 in accordance with some implementations. Integration of P-type and N-type SBDs into a CMOS microfabrication process is implemented by modifying a plurality of process modules optionally selected by photo-lithography. First, these process modules are either existing as part of the FEOL and MOL in the COMS microfabrica-tion process, or added for differentiation, improvements, simplification, effectiveness, costs or a combination of thereof for a corresponding technology node and produced integrated circuits. Second, in some implementations, ion implantation is applied to define a fin structure of a SBD (i.e., a body of each P-type SBD anode and N-type SBD cathode), a diode electrical conduction turn-on/off voltage, series resistance, capacitance, insulation regions from other sections of the fin structure (e.g., regions 420B or 420C), and insulation regions from a N- or P-type silicon substrate or base material (e.g., region 420A). Third, surface cleaning and preparation of the allocated fin sections are implemented to prepare the junction portions 502 of the second fin structures 502 for forming Schottky junctions of the SBDs. Fourth, dielectric spacers 422 and 514 are deposited with fine width patterning, e.g., self-aligned quadruple patterning (SAQP) or any other methods. Fifth, a single-element or compound metal layer is deposited with an electronic work function. The electronic work function is optimized to build reliable Schottky junctions in the CMOS microfabrication process. The metallic material that can be used as a semi-conductor side of the Schottky junction includes, but is not limited to, Nickel, Nickel Silicide, Cobalt, Cobalt Silicide, or other barrier materials that can be used to access the source and drain structures 408 and 410 and the junction access 506.

Referring to FIG. 12A, a photomask is added to protect the junction portion 502A of the second fin structure 502 from being covered by the gate dielectric 404 and gate 406, when the gate dielectric 404 and gate 406 are formed on the first fin structure 402. In some embodiments, the second fin structure 502 is cut off from other fin structures to provide an isolated SBD 1200, and therefore, the anode and cathode of the SBD structure 1200 do not merge with the source structure 408 or drain structure 410 of other P-type or N-type FinFETs. In an example, the junction portion 502A and the electrode portion 502B of the second fin structure 502 do not extend to the two stressor portions of the first fin structure 402 of another P-type or N-type FinFET. Alternatively, local P-type or N-type ion implantations are applied to electrically isolate the second fin structure 502 from other semiconduc-tor devices.

A diode spacer 514 and a spacer portion 502C of the second fin structure 502 are formed to isolate the anode and cathode of the SBD structure 1200. The metallic materials 504 and 508, the metal plugs 510 and 512, and the SBD structure 1200 and its adjacent structures are buried in and separated by the dielectric layer 450, which is optionally a combination of a shallow trench isolation (STI) insulator and an interlayer dielectric (ILD). The dielectric layer 450 has a substantially low dielectric constant, e.g., not greater than that of silicon dioxide (~3.9).

Ohmic contacts are formed along an access path starting from the metal plug 512, passing the second metallic mate-rial 508, the junction access 506 and the electrode portion 502B of the second fin structure 502, and reaching the junction portion 502A of the second fin structure 502. A Schottky junction or contact is formed on three surfaces of the junction portion 502A of the second fin structure 502 by the first metallic material 504.

Referring to FIG. 12B, which corresponds to a B-B' cross section in FIG. 12A, a junction access 506 is formed to contact the second fin structure 502, e.g., by selective epitaxial growth. Optionally, the second metallic material 508 formed on the junction access 506 includes a first metallic layer 508A (e.g., a silicide cap coating the junction access 506) and a second metallic layer 508B filling a second trench. Referring to FIG. 12C, which corresponds to a C-C' cross section in FIG. 12A, the first metallic material 504 is formed on the junction portion 502A of the second fin structure 502. Optionally, the first metallic material 504 formed on the junction portion 502A includes a first metallic layer 504A (e.g., a silicide cap coating the junction portion 502A) and a second metallic layer 504B filling a first trench.

Figure 13:
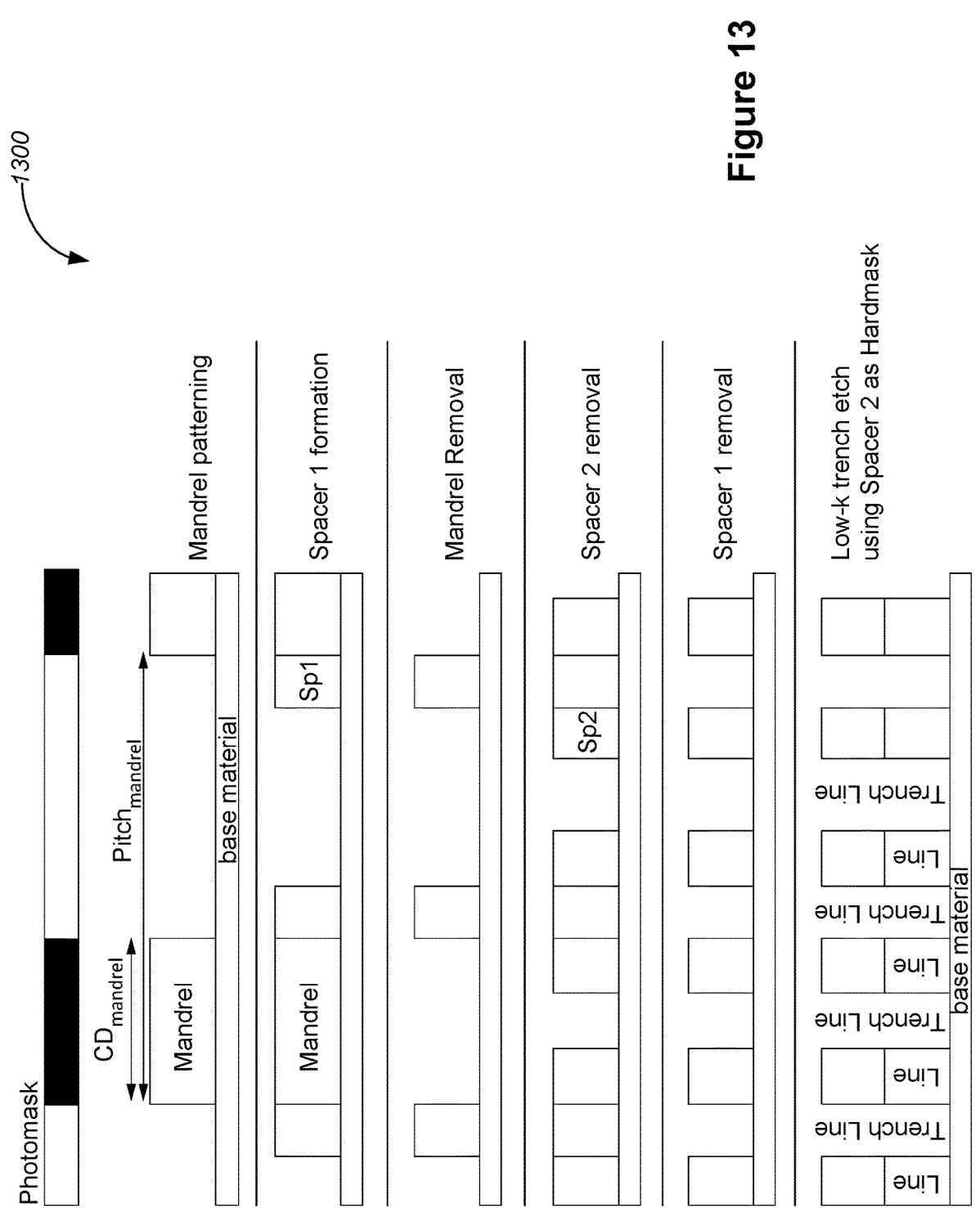
FIG. 13 is a flow of a self-aligned quadruple patterning (SAQP) process applied to form fin structures, spacers and interconnect wires of FinFET and SBD structures in accordance with some implementations.

FIG. 13 is a flow of a self-aligned quadruple patterning (SAQP) process 1300 applied to form fin structures, spacers and interconnect wires of FinFET and SBD structures in accordance with some implementations. The SAQP process includes one or more of mandrel patterning, first space deposition, first spacer etch, core removal, amorphous sili-con (a-Si) etch, second spacer deposition, second spacer etch, silicon nitride etch, titanium nitride etch, trench etch of low-κ dielectric, and metal filling of trenches, and chemical mechanical planarization (CMP).

FIG. 14 is a flow chart of a method 1400 of forming an integrated semiconductor device on a substrate in accor-dance with some implementations. The method 1400 includes forming (1402) a field-effect transistor (FinFET) and a Schottky barrier diode on the substrate 405. Option-ally, the substrate 405 includes a bulk semiconductor sub-strate or a silicon-on-insulator (SOI) substrate. Optionally, the substrate 405 includes a dielectric substrate (e.g., a sapphire substrate). In some implementations, the FinFET has a threshold voltage, and the Schottky barrier diode has a turn-on voltage, and wherein a magnitude of the threshold voltage is greater than a magnitude of the turn-on voltage.

A first fin structure 402 and a second fin structure 502 are formed (1404) on the substrate 405. The first fin structure 402 includes a channel portion 402A extending to two stressor portions 402B on two opposite sides of the channel portion 402A, and the second fin structure 502 includes a junction portion 502A. In some implementations, the sub-strate 405 includes a bulk silicon substrate, and the first and second fin structures 402 and 502 are etched from the bulk silicon substrate. Further, in some implementations, the bulk silicon substrate has a bulk doping concentration, and the junction portion 502A of the second fin structure has a Schottky semiconductor doping concentration that is distinct from the bulk doping concentration. In an example, the bulk silicon substrate is P-type, and the Schottky barrier diode is P-type. A first heavily doped N-type region 420A is formed under the second fin structure 502, and one or more second heavily doped N-type region 420B are formed adjacent to the second fin structure 402 to isolate the Schottky barrier diode from one or more other semiconductor devices on the substrate 405.

A source structure 408 and a drain structure 410 of the FinFET are formed (1406) on the two stressor portions 402B of the first fin structure 402, respectively. A gate dielectric 404 and a gate 406 are formed to cover two or more surfaces of the channel portion 402A of the first fin structure. In some embodiments, a sacrificial gate is formed to facilitate form-ing the transistor spacer 422, and subsequently replaced with the gate dielectric 404 and gate 406

A source metallic material 412, a drain metallic material 414, a first metallic material 504 are formed (1408) to be electrically coupled to the source structure 408, the drain structure 410, and the junction portion 502A of the second fin structure 502, respectively, thereby providing a Schottky junction between the junction portion 502A of the second fin structure 502 and the first metallic material 504. In some implementations, the junction portion extends to an electrode portion in the second fin structure, and a junction access 506 is disposed (1410) on the electrode portion 502B of the second fin structure 502. Optionally, the junction access 506 is partially wrapped around the electrode portion 502B. A second metallic material 508 is formed (1412) and electrically coupled to the junction access 506. In the Schottky barrier diode, the junction portion 502A of the second fin structure is electrically coupled to the second metallic material 508 via the junction access 506 and the electrode portion 502B of the second fin structure.

Further, in some implementations, the second fin structure 502 further includes a spacer portion 502C connecting the junction portion 502A to the electrode portion 502B, and the junction access 506 at least partially wraps around the electrode portion 502B and does not contact any surface of the spacer portion 502C. A gate dielectric 404 and a gate 406 are formed to cover two or more surfaces of the channel portion 402A of the first fin structure. A transistor spacer 422 separates the gate 406 from the source structure 408. A diode spacer 514 separates the first metallic material 504 from the junction access 506 or the second metallic material 508. The diode spacer 514 is thicker than the transistor spacer 422.

In some implementations, the FinFET 600 is N-type and the SBD 700 is N-type. The first fin structure 402 is P-type, and the second fin structure 502 is N-type. The source structure 408, the drain structure 410 and the junction access 506 is made of epitaxial silicon carbide. In some implementations, the source structure 408, the drain structure 410 and the junction access 506 can be doped with Arsenic or Phosphorus. Conversely, in some implementations, the FinFET 800 is P-type and the SBD 900 is P-type. The first fin structure 402 is N-type, and the second fin structure 502 is P-type. The source structure 408, the drain structure 410 and the junction access 506 is made of epitaxial silicon germanium. In some implementations, the source structure 408, the drain structure 410 and the junction access 506 can be doped with Boron.

In some implementations, a subset of the two stressor portions 402B of the first fin structure 402 and the electrode portion 502B of the second fin structure 502 is at least partially recessed and electrically coupled to a respective one of the source structure 408, the drain structure 410 and the junction access 506.

In some implementations, a plurality of trenches are formed and include a source trench, a drain trench, and a first trench for accessing the source structure 408, the drain structure 410 and the junction access 506 of the second fin structure, respectively The source trench, the drain trench, and the first trench are filled with the with the source metallic material 412, the drain metallic material 414, and the first metallic material 504, respectively. In some implementations, the plurality of trenches includes a second trench filled with the second metallic material 508 for electrically coupling to the junction portion of the second fin structure via the junction access 506 and the electrode portion 502B of the second fin structure.

Further, in some implementations, a plurality of metal plugs are formed on the plurality of trenches. The plurality of metal plugs includes a first plug 510 electrically coupled to the first metallic material 412 filling the first trench, and a second plug 512 electrically coupled to the junction portion 502A of the second fin structure via the second metallic material 508 filling the second trench, the junction access 506, and the electrode portion 502B of the second fin structure. Conversely, in some implementations, the plurality of metal plugs includes a source plug 416 and a drain plug 418 that are electrically coupled to the source and drain structures 408 and 410 of the FinFET, respectively.

In some embodiments, referring to FIGS. 9A-9D, the Schottky barrier diode includes a P-type Schottky barrier diode. The junction portion 502A of the second fin structure is P-type, and the second metal plug 512, the second metallic material 508 filling the second trench, the junction access 506, and the electrode portion 502A of the second fin structure form an anode of the Schottky barrier diode. The first metallic material 504 and the first metal plug 510 form a cathode of the Schottky barrier diode. Conversely, referring to FIGS. 5A-5D, 7A-7D and 11A-11D, the Schottky barrier diode includes an N-type Schottky barrier diode. The junction portion 502A of the second fin structure is N-type, and the second metal plug 512, the second metallic material 508 filling the second trench, the junction access 506, and the electrode portion 502A of the second fin structure form a cathode of the Schottky barrier diode. The first metallic material 504 and the first metal plug 510 form an anode of the Schottky barrier diode.

In some implementations, the source metallic material 412, the drain metallic material 414, and the first metallic material 504 are one of cobalt silicide and nickel silicide, and the Schottky junction is formed between the junction portion 502A of the second fin structure and the one of cobalt silicide and nickel silicide. Alternatively, in some implementations, each of the source metallic material 412, the drain metallic material 414, and the first metallic material 504 includes a first metallic layer and a second metallic layer, the second metallic layer contacting the respective one of the source structure 408, the drain structure 410, and the junction portion 502A of the second fin structure. The second metallic layer includes one of cobalt silicide and nickel silicide.

In some implementations, the first fin structure 402 and the second fin structure 502 are formed using the same photomasks and processing modules. The first and second fin structures can be doped differently using different doping processes. One or more stressor layers are deposited covering the substrate and the first and second fin structures 402 and 502. The source structure 408 and drain structure 410 of the N-type FinFET and the junction access 506 of the N-type SBD are patterned from the same stressor layer. The source structure 408 and drain structure 410 of the P-type FinFET and the junction access 506 of the P-type SBD are patterned from the same stressor layer. The plurality of trenches are opened on the dielectric layer 450 via the same etching operation. The source, drain, first and drain metallic materials have the same type of metallic materials applied to fill the trenches via the same physical or mechanical deposition operations. Likewise, the metal plugs 416, 418, 510 and 512 are patterned from the same metal layer.

Although the Schottky barrier diode is compatible with most of a CMOS microfabrication process, additional photomasks are added and existing photomasks are modified to integrate the Schottky barrier diode. For example, the second fin structure 502 of the Schottky barrier diode is not covered by the gate dielectric 404 and the gate 406. One or more photomasks are added to protect the second fin structure 502 from deposition of the gate dielectric 404 and the gate 406 or remove the gate dielectric 404 and the gate 406 from the second fin structure 502. More details on modification of an example CMOS microfabrication process is explained in Table 1 as follows:

TABLE 1

Example Process Integration for Manufacturing Schottky Barrier Diodes

| CMOS Pocess Module | Schottky-based CMOS (SCMOS): Addition (A) or Modification (M) | SCMOS Related Comments |
|---|---|---|
| Si Wafer Preparation | None | Case of FinFET on bulk P-type silicon substrate |
| Formation of Fins | None | FEOL first Module- No A/M |
| Doping of P-Well | M: P-Well | Doping adjustment of substrate under fin and its bottom for N-LtSBD |
| Doping of N-Wells | M: N-Well | Isolation from P- substrate and doping adjustment for P-LtSBD fin |
| Pre-STI identifications of P/N Fins (0 to typically 4) | None/M: for optimized P&N-LtSBDs (options) | The I-V of each LtSBD type is optimized by the selection by processing module of some available identifications |
| Shallow Trench Isolation | (STI) - None | Part of fin selection for LtSBD |
| Post-STI identifications of P/N-Fin (0 to typically 4) | None/M: for optimized P&N-LtSBDs (options) | The I-V of each LtSBD type is optimized by the processing module selection of some available identifications |
| Formation of sacrificial gates and source/drain Spacers, case of high κ dielectric metal gate (HKMG) Last or final gate in case of HKMG First, with several processing module for as many gate oxide thicknesses | M: Metal Gate Electrode (MGE), sections of fin allocated for LtSBD barrier metal plates are masked out, as well as all source/drains. | In this case of HKMG Last, this processing module and its associated modules build a Sacrificial Gate, which defines the isolation spacers of the FET final gate to its source/drain. The solation spacers are used to isolate the anode and cathode electrodes, or barrier metal plate to the fin body contact. |
| Post-STI identifications of P/N-Fin (3 to 8 - Halo/LDD source/drain) | None/M: for optimized P&N-LtSBDs (options) | The I-V of each LtSBD type is optimized by the processing module selection of some available identifications |
| Formation of P+ source/drain by SE of SiGe or II of B. | M: P+ Stressor SE or source/drain fin sections II; or A: for barrier metal Option 1 | P+ source/drains are used to make an as low as possible ohmic contact between the fin body and the metal plug electrode of a P-LtSBD. A metal-silicide, or metal deposition followed by silicidation is in some cases performed. The deposition or the silcidation may combined with other steps like later/final high-temperature activation. |
| Formation of N+ source/drain by SiC Selective Epitaxy | M: N+ Stressor SE or source/drain fin sections II; or A: for barrier metal Option 1 | N+ sources/drains are used to make an as low as possible ohmic contact between the fin body and the A metal plug electrode of a P-LtSBD. A metal-silicide, or metal deposition followed by silicidation is in some cases performed. The Deposition or the silicidation may be combined with other steps like late high-temperature activation. |
| Replacement Gate, case of HKMG Last; possible Activation only in case of HKMG First with no processing module needed. | A/M: sections of fin allocated for LtSBD barrier metal plates are masked out, as well as all source/drains. | Activation steps possibly used for LtSBDs, with possibility of self-alignment (no processing module). End of FEOL Modules Sequence. Possibility to use this module with the same metal/silicide with adding the deposition of a different one for the barrier metal of LtSBDs, as Option 3, with final device cross sections similar to the case of Option 2. |
| Trench Cut for contact to all source/drain - M1 connections | M: LtSBD Options 1 & 2 | MOL first Module LtSBD Fins may be selected if etching is compatible to both fin and source/drain pads. |
| ILD Cut to expose and clean/preprocess LtSBD fin sections. | A: LtSBD Option 2 and possibly Option 1 | Likely necessary, with steps added to modify the Metal-Si Interface by Oxidation, Film Deposition and/or II. |
| source/drain Trench Filling | No processing module | Possible High-temperature silicidation or activation steps added to this module. |
| Cut of Contact Plug of source/drain Trench to M1 | None | Contact LtSBD barrier metal, Options 1 and 2 cases |
| Cut of Contact Plug of MGE to M1 | None | Contact LtSBD barrier metal, Options 3 case |
| Plug Filling and ILD | No processing module | End of MOL Modules Sequence |

Other CMOS microfabrication process can be similarly modified to integrate Schottky barrier diode into CMOS integrated circuit.

In summary, P-type and N-type Schottky barrier diodes are formed by a barrier metal plate, preferably but not limited to Cobalt Silicide or Nickel Silicide, contacting one or both walls of a section of silicon fin (e.g., the junction portion 502A of the second fin structures 502 in FIGS. 5, 7, 9 and 11), as well as possibly the top of the section of the silicon fin. The silicon fin is preferably defined and built using identical microfabrication methods and steps as those used to provide fin structures of FinFETs. The structure of these diodes and the possible ways to connect their anode (A) and cathode (K) terminals to those of other circuit components on the silicon substrate are listed in Table 2 as follows:

similarly, a second type of audio feature can be termed a first type of audio feature, without departing from the scope of the various described embodiments. The first type of audio feature and the second type of audio feature are both types of audio features, but they are not the same type of audio feature.

The terminology used in the description of the various described embodiments herein is for the purpose of describing particular embodiments only and is not intended to be limiting. As used in the description of the various described

TABLE 2

| Components of LtSBD structures | | | |
|---|---|---|---|
| | Body | Anode (A) | Cathode (K) |
| P-type SBD | P-type silicon fin preferably doped in the same way as a channel of an N-type FinFET on the same substrate | P+ doped part of the silicon fin section, or head of a stressor material such as Silicon Germanium (SiGe), e.g., a junction access 506. In both cases, the composition of the P+ anode is preferably the same as the P+ source or drain of the P-type FinFET. The P+ anode is connected to at least one terminal of another component (i) by a metal plug, either straight or extended, preferably of the same composition as for its cathode, which makes an ohmic contact to a set of wiring segments of the various metal interconnection layers available, or inclusively (ii) by being shared with the P+ source or drain of another P-type FinFET, or the P+ anode of another P-type SBD, or the P+ region of any other semiconductor devices on the same substrate. | Barrier metal plate. It is connected to at least one terminal of another component by a metal plug, either straight or defined by extending its material deposition trench, thereby sharing it with other component terminal(s). The metal plug, is preferably filled with the same barrier metal material, and formed the same way as for connecting any P+ source or drain of P-type FinFETs. It makes an ohmic contact to a set of wiring segments of the metal interconnection layers. |
| N-type SBD | N-type silicon fin preferably doped in the same way as a channel of a P-type FinFET formed on the same substrate | Barrier metal plate. It is connected to at least one terminal of another semiconductor device by a metal plug, either straight or defined by extending its material deposition trench, thereby sharing it with other component terminal(s). The metal plug, is preferably filled with the same barrier metal material, and formed the same way as for connecting to any N+ source or drain of N-type FinFETs. It makes an ohmic contact to a set of wiring segments of metal interconnection layers. | N+ doped part of the silicon fin section, or head of a stressor material such as Silicon Carbide (SiC). In both cases, the composition of the N+ cathode is preferably the same as the N+ source or drain of the N-type FinFET.. The N+ cathode is connected to at least one terminal of another component (i) by a metal plug, either straight or extended, preferably of the same composition as for its anode, which makes an ohmic contact to a set of wiring segments of the metal interconnection layers, or inclusively (ii) by being shared with the N+ source or drain of a N-type FinFET, or the N+ cathode of another N-type SBD, or the P+ region of any other semiconductor devices on the same substrate. |

It should be understood that the particular order in which the operations in each of the above figures have been described are merely exemplary and are not intended to indicate that the described order is the only order in which the operations could be performed. One of ordinary skill in the art would recognize various ways to form an integrated semiconductor device having a FinFET and a Schottky barrier diode on the same substrate as described herein. Additionally, it should be noted that details described with respect to one of the above processes are also applicable in an analogous manner to any other ones of the above processes. For brevity, the analogous details are not repeated.

It will also be understood that, although the terms first, second, etc. are, in some instances, used herein to describe various elements, these elements should not be limited by these terms. These terms are only used to distinguish one element from another. For example, a first type of audio feature can be termed a second type of audio feature, and, embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method of forming an integrated semiconductor device, comprising:

forming a fin field-effect transistor (FinFET) and a Schottky barrier diode on a substrate, including:

forming a first fin structure and a second fin structure, wherein the first fin structure includes a channel portion extending to two stressor portions on two opposite sides of the channel portion, and the second fin structure includes a junction portion;

forming a source structure and a drain structure of the FinFET on the two stressor portions of the first fin structure, respectively; and forming a source metallic material, a drain metallic material, a first metallic material that are electrically coupled to the source structure, the drain structure, and the junction portion of the second fin structure, respectively, thereby providing a Schottky junction between the junction portion of the second fin structure and the first metallic material;

defining a junction access, wherein the junction portion extends to an electrode portion of the second fin structure, and the junction access is disposed on the electrode portion; and forming a second metallic material electrically coupled to the junction access;

wherein in the Schottky barrier diode, the junction portion of the second fin structure is electrically coupled to the second metallic material via the junction access and the electrode portion of the second fin structure.

2. The method of claim 1, wherein the second fin structure further includes a spacer portion connecting the junction portion to the electrode portion, and the junction access at least partially wraps around the electrode portion and does not contact any surface of the spacer portion.

3. The method of claim 1, comprising:

forming a gate dielectric and a gate covering two or more surfaces of the channel portion of the first fin structure;

forming a transistor spacer separating the gate from the source structure; and forming a diode spacer separating the first metallic material from the junction access and the second metallic material;

wherein the diode spacer is thicker than the transistor spacer.

4. The method of claim 1, wherein:

the FinFET is N-type and the Schottky barrier diode is N-type;

the source structure, the drain structure and the junction access is made of epitaxial silicon carbide.

5. The method of claim 1, wherein:

the FinFET is P-type and the Schottky barrier diode is P-type;

the source structure, the drain structure and the junction access is made of epitaxial silicon germanium.

6. The method of claim 1, wherein the FinFET is N-type and the Schottky barrier diode is N-type, and the source structure, the drain structure and the junction access are doped with Arsenic or Phosphorus.

7. The method of claim 1, wherein a subset of the two stressor portions of the first fin structure and the electrode portion of the second fin structure is at least partially recessed and electrically coupled to a respective one of the source structure, the drain structure and the junction access.

8. An integrated semiconductor device, comprising:

(1) a substrate;

(2) a field-effect transistor (FinFET) formed on the substrate and having a first fin structure, a gate dielectric, a gate, a source structure and a drain structure, wherein:

the first fin structure includes a channel portion extending to two stressor portions on two opposite sides of the channel portion;

the source structure is electrically coupled to a source metallic material; and the drain structure is electrically coupled to a drain metallic material; and (3) a Schottky barrier diode formed on the substrate and having a second fin structure and a first metallic material, wherein:

the second fin structure includes a junction portion;

the junction portion forms a Schottky junction with the first metallic material;

wherein the first and second fin structures are made of the same type of material; and wherein the same type of electrically conductive material is used to provide the first, source, and drain metallic materials; and wherein the substrate includes a bulk silicon substrate, and the first and second fin structures are etched from the bulk silicon substrate, and wherein the bulk silicon substrate has a bulk doping concentration, and the junction portion of the second fin structure has a Schottky semiconductor doping concentration that is distinct from the bulk doping concentration.

9. The integrated semiconductor device of claim 8, further comprising a plurality of trenches including a source trench, a drain trench, and a first trench for accessing the source structure, the drain structure, and the junction portion of the second fin structure, respectively, wherein the source trench, the drain trench, and the first trench are filled with the source metallic material, the drain metallic material, and the first metallic material.

10. The integrated semiconductor device of claim 9, wherein the plurality of trenches includes a second trench filled with a second metallic material for electrically coupling to the junction portion of the second fin structure via a junction access and an electrode portion of the second fin structure.

11. The integrated semiconductor device of claim 10, further comprising a plurality of metal plugs on the plurality of trenches, wherein the plurality of metal plugs includes a first plug electrically coupled to the first metallic material filling the first trench, and a second plug electrically coupled to the junction portion of the second fin structure via the second metallic material filling the second trench, the junction access, and the electrode portion of the second fin structure.

12. The integrated semiconductor device of claim 11, wherein the plurality of metal plugs includes a source plug and a drain plug that are electrically coupled to the source and drain structures of the FinFET, respectively.

13. The integrated semiconductor device of claim 11, wherein:
  the Schottky barrier diode includes a P-type Schottky barrier diode; and
  the junction portion of the second fin structure is P-type, and the second plug, the second metallic material filling the second trench, the junction access, and the electrode portion of the second fin structure form an anode of the Schottky barrier diode.

14. The integrated semiconductor device of claim 11, wherein:
  the Schottky barrier diode includes a P-type Schottky barrier diode; and
  the junction portion of the second fin structure is P-type, and the first plug is coupled to the first metallic material filling the first trench and forms a cathode of the Schottky barrier diode.

15. The integrated semiconductor device of claim 8, wherein the source metallic material, the drain metallic material, and the first metallic material are one of cobalt silicide and nickel silicide, and the Schottky junction is formed between the junction portion of the second fin structure and the one of cobalt silicide and nickel silicide.

16. The integrated semiconductor device of claim 8, wherein each of the source metallic material, the drain metallic material, and the first metallic material includes a first metallic layer and a second metallic layer, the second metallic layer contacting the respective one of the source structure, the drain structure, and the junction portion of the second fin structure, the second metallic layer including one of cobalt silicide and nickel silicide.

17. The integrated semiconductor device of claim 8, wherein the FinFET has a threshold voltage, and the Schottky barrier diode has a turn-on voltage, and wherein a magnitude of the threshold voltage is greater than a magnitude of the turn-on voltage.

18. An integrated semiconductor device, comprising:
  a substrate;
  a first fin structure and a second fin structure, the first fin structure including a channel portion extending to two stressor portions on two opposite sides of the channel portion, the second fin structure includes a junction portion;
  a source structure and a drain structure, wherein the source and drain structures are disposed on the two stressor portions of the first fin structure, respectively;
  a junction access, wherein the junction portion extends to an electrode portion of the second fin structure, and the junction access is disposed on the electrode portion; and
  an electrically conductive material, including a source metallic material, a drain metallic material, and a first metallic material that are electrically coupled to the source structure, the drain structure, and the junction portion of the second fin structure, respectively, wherein a second metallic material is electrically coupled to the junction access, and the junction portion of the second fin structure is electrically coupled to the second metallic material via the junction access and the electrode portion of the second fin structure;
  wherein a fin field-effect transistor (FinFET) is formed on the substrate and includes the channel portion of the first fin structure, the source structure and the drain structure; and
  wherein a Schottky barrier diode is formed on the substrate and includes a Schottky junction between the junction portion of the second fin structure and the first metallic material.

19. The integrated semiconductor device of claim 18, wherein the second fin structure further includes a spacer portion connecting the junction portion to the electrode portion, and the junction access at least partially wraps around the electrode portion and does not contact any surface of the spacer portion.

20. The integrated semiconductor device of claim 18, further comprising:
  a gate dielectric and a gate covering two or more surfaces of the channel portion of the first fin structure;
  a transistor spacer separating the gate from the source structure; and
  a diode spacer separating the first metallic material from the junction access and the second metallic material;
  wherein the diode spacer is thicker than the transistor spacer.

* * * * *